(12) United States Patent
Herner

(10) Patent No.: US 10,026,864 B2
(45) Date of Patent: Jul. 17, 2018

(54) PACKAGE-LESS LED ASSEMBLY AND METHOD

(71) Applicant: Scott Brad Herner, Lafayette, CO (US)

(72) Inventor: Scott Brad Herner, Lafayette, CO (US)

(73) Assignee: BLACK PEAK LLC, Lafayette, CO (US)

( * ) Notice: Subject to any disclaimer, the term of this patent is extended or adjusted under 35 U.S.C. 154(b) by 164 days.

(21) Appl. No.: 15/043,540

(22) Filed: Feb. 13, 2016

(65) Prior Publication Data
US 2017/0238419 A1 Aug. 17, 2017

(51) Int. Cl.
*H01L 33/00* (2010.01)

(52) U.S. Cl.
CPC .................. *H01L 33/00* (2013.01)

(58) Field of Classification Search
CPC ........................................ H01L 33/00
See application file for complete search history.

(56) References Cited

U.S. PATENT DOCUMENTS

| | | | | |
|---|---|---|---|---|
| 6,998,281 B2 * | 2/2006 | Taskar | ........... | H01L 33/105 257/E25.02 |
| 7,622,746 B1 * | 11/2009 | Lester | ........... | H01L 33/387 257/98 |
| 2004/0188696 A1 * | 9/2004 | Hsing Chen | ........... | H01L 24/97 257/99 |
| 2007/0252512 A1 * | 11/2007 | Bertram | ........... | C09K 11/7774 313/503 |
| 2008/0042153 A1 * | 2/2008 | Beeson | ........... | H05B 33/10 257/94 |
| 2008/0144688 A1 * | 6/2008 | Chua | ........... | H01L 33/405 372/50.1 |
| 2012/0181568 A1 * | 7/2012 | Hsia | ........... | H01L 33/0095 257/99 |
| 2014/0186979 A1 * | 7/2014 | Tu | ........... | H01L 33/52 438/27 |

(Continued)

FOREIGN PATENT DOCUMENTS

JP    2013062526 A   *   4/2013

OTHER PUBLICATIONS

Longford and Klowak, Utilising Advanced Packaging Technologies to enable Smaller, More Efficient GaN Power Devices, Sep. 2013. pp. 1-5, Microelectronics Packaging Conference Proceedings, IEEE, Piscataway, NJ, USA.

(Continued)

*Primary Examiner* — Charlie Y Peng
(74) *Attorney, Agent, or Firm* — Scott Brad Herner

(57) ABSTRACT

This application describes an assembly suitable for emitting light, and methods of forming the same. The assembly includes a single crystal substrate with first and second surfaces, a plurality of LEDs in immediate contact with the first surface of the substrate. The LEDs are substantially crystal lattice matched with the substrate. The plurality of LEDs includes three or more LEDs that are not in electrical contact with any other LED, and there is a gap between each LED of the plurality and its nearest neighbor LED. The assembly includes phosphor-containing encapsulant layers overlying at least a portion of the LEDs.

43 Claims, 20 Drawing Sheets

(56) References Cited

U.S. PATENT DOCUMENTS

2014/0264266 A1* 9/2014 Li .................. H01L 33/486
257/13
2015/0380389 A1* 12/2015 Odnoblyudov ..... H01L 25/0753
257/89

OTHER PUBLICATIONS

Brusberg, Queisser, Neitz, Schröder, and Lang, $CO_2$-Laser Drilling of TGVs for Glass Interposer Applications, 2014, Electronic Components and Technology Conference (ECTC), 2014 IEEE $64^{th}$, pp. 1759-1764, IEEE, Piscataway, NJ, USA.
Howlander, Zhang, Deen, Suga, and Yamaguchi, Surface activated bonding of copper through silicon vias and gold stud bumps at room temperature, Mar./Apr. 2011, Journal of Vacuum Science and Technology A 29 (2), pp. 021007-102100707, American Vacuum Society.
Burgin, Jubera, Debéda, Glorieux, Garcia, and Lucat, Screen-printed phosphor coatings for white LED emission, 2011, pp. 2235-2241, Journal of Materials Science, Springer.
Nakamura and Krames, History of Gallium-Nitride-Based Light-Emitting Diodes for Illumination, 2013, Proceedings of the IEEE vol. 101, 10, pp. 1-10, IEEE, Piscataway, NJ, USA.
Levi, Novel Prize in Physics recognizes research leading to high-brightness blue LEDs, Dec. 2014, Physics Today, pp. 14-17.
Rahman, Solid-state lightning with wide band gap semiconductor, 2014, MRS Energy & Sustainability: A Review Journal, pp. 1-18, Materials Research Society.

* cited by examiner

PACKAGE-LESS LED ASSEMBLY AND METHOD

FIELD

The embodiments of the invention are directed generally to assemblies of light-emitting diodes (LEDs), and specifically to assemblies used for backlit units (BLUs) with smaller form factor and less expensive manufacture.

BACKGROUND

Flat panel displays typically consist of many BLUs. Currently, BLUs typically consist of an assembly of three or more singulated LED dies, a metal lead frame package, and elements such as phosphors and encapsulants. The cost of this conventional assembly is dominated by the metal lead frame package and multiple manufacturing steps. A conventional assembly with metal lead frame packages and LEDs has a large form factor. It is advantageous to reduce the cost and form factor of an assembly of LEDs.

BRIEF SUMMARY OF THE PRESENT INVENTION

The present invention provides for an assembly of LEDs suitable for use as a BLU, which can be made in a smaller form factor and manufactured at lower cost than present conventional assemblies and methods. The invention does not use a lead frame package or wiring bonding. A specific embodiment of the invention includes a single crystal substrate and a plurality of LEDs, the plurality including three or more LEDs. The single crystal substrate has a first surface and a second surface opposite the first surface. The first surface has an area less than 50 mm$^2$. The plurality of LEDs is in immediate physical contact with the first surface of the substrate. The LEDs are substantially crystal lattice matched with the substrate. Each LED is not in electrical contact with any other LED. There is a gap between each LED of the plurality and its nearest neighbor LED.

Another exemplary embodiment of the present invention provides for a single crystal substrate, a plurality of LEDs in immediate physical contact with the substrate, a dielectric layer, and at least a phosphor in first phosphor-containing encapsulant layer and a second phosphor in a second phosphor-containing encapsulant layer. The substrate has a first surface and a second surface opposite first surface. The area of the first surface of the substrate is less than about 50 mm$^2$. The LEDs are substantially crystal lattice matched with the substrate. The plurality of LEDs includes three or more LEDs, and each LED is not in electrical contact with any other LED. There is a gap between each LED of the plurality and its nearest neighbor LED. Each phosphor-containing encapsulant layer overlies at least a portion of one or more LEDs of the plurality.

Yet another exemplary embodiment of the invention provides for a BLU comprising a plurality of completed assemblies that emit multispectral light attached to one or more panels. The assemblies comprise a substrate, a plurality of LEDs, a dielectric layer overlying the plurality of LEDs, a plurality of vias formed through the substrate and dielectric layer, a plurality of wires, and two or more phosphor-containing encapsulant layers. The substrate is a single crystal material having first surface and a second surface opposite the first surface. The plurality of LEDs is in immediate physical contact with the first surface of the substrate. The LEDs are substantially crystal lattice matched with the substrate. The plurality of LEDs includes three or more LEDs, each LED is not in electrical contact with any other LED, and there is a gap between each LED of the plurality and its nearest neighbor LED. The dielectric layer overlies the plurality of LEDs. Each via has a wire extending through a respective via. Each phosphor-containing encapsulant layer overlies at least a portion of one or more LEDs of the plurality.

In one embodiment of the present invention a method for forming an assembly suitable for emitting light comprises providing a substrate, forming a group of LEDs in immediate physical contact with the substrate, and dividing the substrate and group of LEDs to create discrete assemblies. The substrate is a single crystal material having a first surface and a second surface, and the second surface is opposite the first surface. The group of LEDs is substantially crystal lattice matched with the substrate. Each LED of the group is not in electrical contact with any other LED of the group. Each of the assemblies comprises a plurality of LEDs from the group of LEDs, and each plurality comprises at least three LEDs.

A different embodiment provides for a method for forming assemblies suitable for emitting light comprises providing a substrate of a single crystal material, forming a group of LEDs, and providing two or more phosphor-containing encapsulant layers. The substrate has a first surface and a second surface. The second surface is opposite the first surface. The group of LEDs is substantially crystal lattice matched with the substrate. Each LED of the group is not in electrical contact with any other LED of the group. Each phosphor-containing encapsulant layer overlies at least portions of two or more LEDs of the group.

These and other aspects and advantages of the invention will become apparent from the following detailed description and the accompanying drawings, which illustrate by way of example the features of the invention. One skilled in the art would recognize other variations, modifications, and alternatives.

BRIEF DESCRIPTION OF THE DRAWINGS

These and other features, aspects, and advantages of the present invention will become better understood with regard to the following description, appended claims, and accompanying drawings, where:

DISCUSSION OF PRIOR ART FABRICATION METHODS

Figure 1:
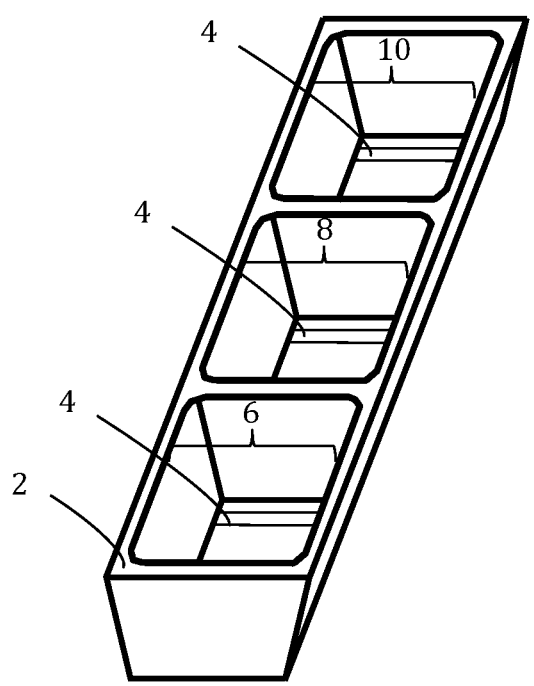
FIG. 1 is an isometric view of a prior art lead frame package.

First, a conventional method of manufacturing an assembly of LEDs is described. The two main components of a conventional prior art assembly, the LED dies and the lead frame package, are described, and then the steps to manufacturing the conventional assembly are described. In a subsequent section, the embodiments of the present invention which has no lead frame package are described. All references to top and bottom are made considering the substrate being at the bottom. This nomenclature is introduced for the ease of understanding only, and should not be considered as limiting to specific assembly, orientation, etc. When reference is made herein to a method comprising two or more defined steps, the defined steps can be carried out in any order or simultaneously (except where context or specific instruction excludes that possibility), and the method can include one or more other steps carried out before any of the defined steps, between two of the defined steps, or after all the defined steps (except where context excludes that possibility).

BLUs typically produce white light for illumination. White light is composed of light of several different wavelengths. Light composed mostly of one wavelength corresponds to a color, such as blue, depending on the wavelength. One method to produce white light for a BLU is to combine several wavelengths of light, such as red, green, and blue, in very close proximity to one another, a so-called multi-spectral source. Several individual LEDs that produce different single wavelengths of light may be placed next to one another so that their combined light is white. Another method to produce a multi-spectral source is to modify the wavelengths of light emanating from LEDs of the same wavelength by the use of phosphors. A phosphor is a material that is excited by light, typically composed of one dominant wavelength or wavelengths, and then re-emits light with a different dominant wavelength or wavelengths. Phosphors are typically produced in ceramic powder form, and the powder is typically mixed with an encapsulant material such as silicone for use with LEDs. The encapsulant material and phosphor mix can coat an LED more effectively than powder alone, and the encapsulant material imparts an adhesive property to the mix. Through the use of phosphors, the wavelengths of light from LEDs that all produce the same dominant wavelength of light can be modified to produce different wavelengths. In this manner, two of the assembly of three LEDs that all produce the same wavelength of light can be coated with different phosphors, resulting in three different wavelengths of light from the assembly. Methods to produce white light from a conventional assembly of LEDs, with the LEDs all emitting the same wavelength of light, will be described.

Assembling LED dies into a multispectral, assembly for use in BLUs is a costly process involving multiple placements of single LED dies into a lead frame package, wire bonding the LEDs to the lead frame package, and encasing each LED die within the lead frame package with an encapsulant. Each of these steps requires individual mechanical operation on a single LED die. The multiple fabrication steps are prone to failure.

In this discussion the term "LED die" is used when the individual LED and a small piece of the substrate has been divided from a larger substrate containing many LEDs. The term "LED" is used to describe the semiconductor, insulating, and conducting layers but not the substrate. This process of dividing a substrate with many LEDs into single LED dies is called singulation. The substrate is the material upon which semiconductor, insulating, and conducting layers forming the LED are deposited. The LEDs are typically fabricated en masse on the substrate, using such manufacturing steps as lithographic patterning and etching, among others. The resulting substrate with many LEDs can then be singulated into individual LED die.

FIG. 1 shows one example of a conventional prior art lead frame package. This lead frame package enables three LED die to be combined into one assembly to produce white light. The lead frame package is typically composed of an insulating composite material 2, which may comprise titanium oxide and a polymer, and conductive metal strips 4. The lead frame package shown in FIG. 1 has three tubs 6, 8, and 10, each of which will receive an LED die and associated components. Lead frame packages may have more than three tubs.

Figure 2:
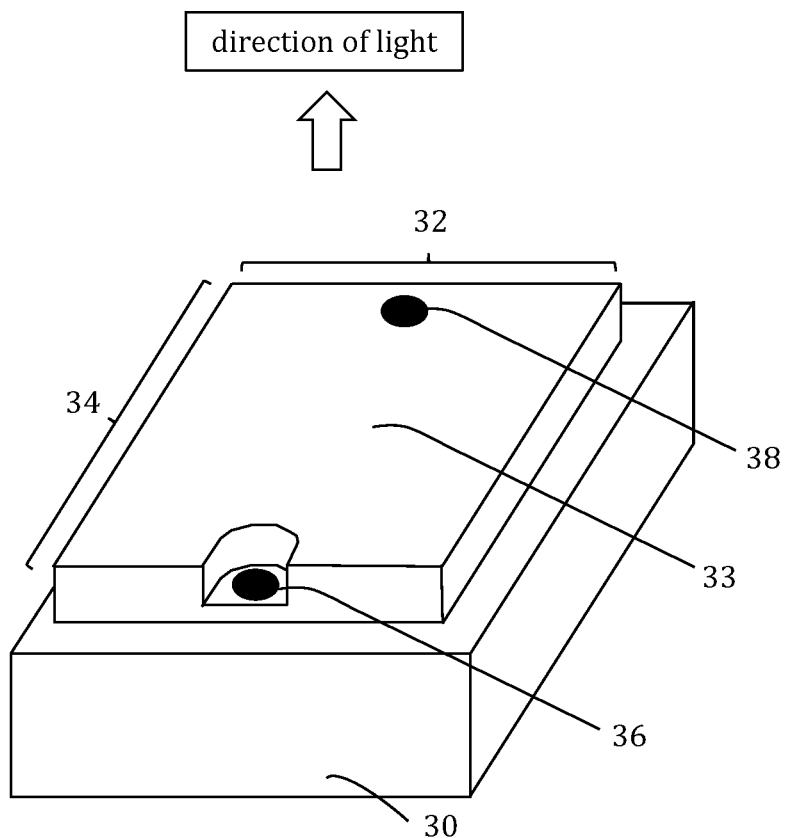
FIG. 2 schematically illustrates an isometric view of a typical prior art LED die and the direction of light emanating from the LED.

An example of a typical prior art LED die is shown schematically in FIG. 2. The schematic is not to scale and the thickness of the layers is exaggerated for clarity. The substrate 30 is typically slightly larger in area than the LED 33. The LED 33 consists of multiple semiconducting and conductive layers. LEDs may be 200 to 500 microns in either width 32 or length 34, usually being square or rectangular in plan view, and so the largest side dimension will be referred to. On the opposite face of the substrate 30 (backside), there may be a reflective layer such as aluminum or silver, or a distributed Bragg reflector. This layer is not shown in FIG. 2. This reflective layer reflects the light produced in the LED and concentrates its flux in one direction, indicated in FIG. 2. Conductive contacts 36 and 38 contact the n-type layer and the p-type layer of LED 33, respectively, and will be discussed later.

Figure 3A:
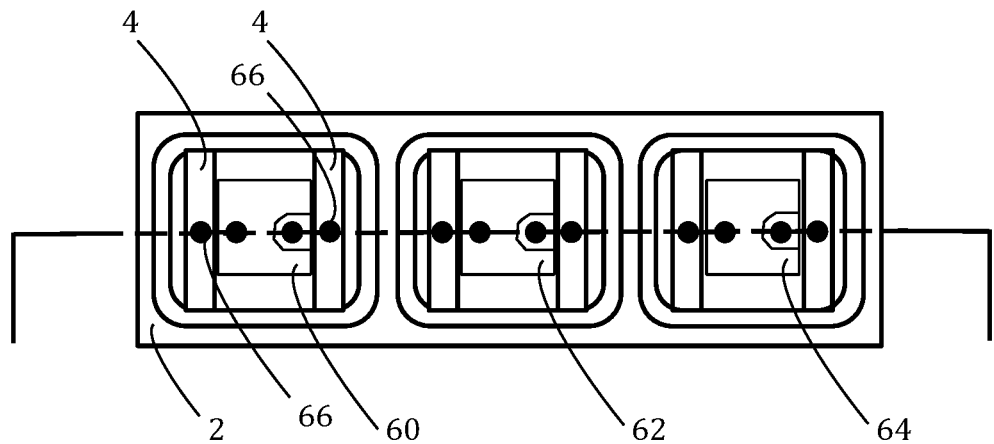
FIGS. 3A and 3B schematically illustrate a plan and a cross sectional view, respectively, of a typical prior art lead frame package with LED dies.

An example of a prior art lead frame package with LED dies and wire bonds is shown in FIG. 3A in plan view. A lead frame package with LED dies, wire bonds, and encapsulants is shown in cross section in FIG. 3B. The encapsulant layers are not shown in FIG. 3A for clarity. The LED dies 60, 62, and 64 are mechanically affixed to the bottom of the tubs, typically with a polymer adhesive 70. The LED dies 60, 62, and 64 are electrically connected to the metal strips 4 on the lead frame package by wire bonds 66. Each wire bond 66 is formed individually, a costly and time-consuming process.

Figure 3B:
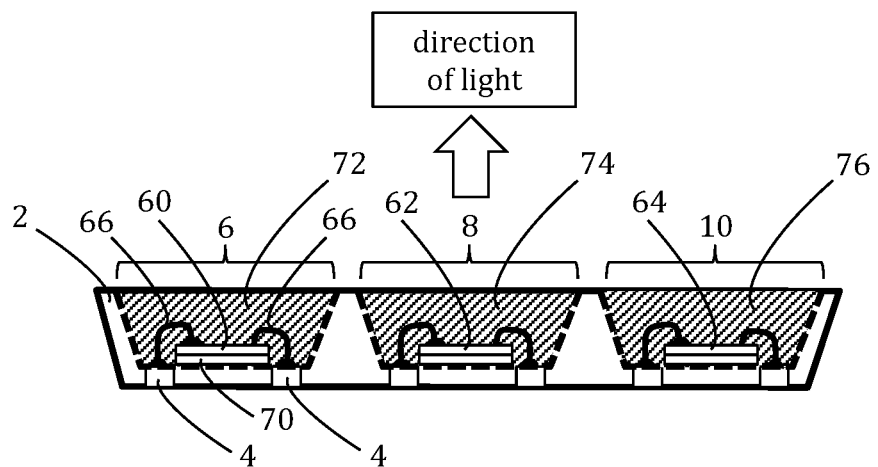

An LED die is typically protected against intrusion of mobile ions such as sodium with an encapsulant layer such as silicone. The encapsulant layer can also help concentrate light in one direction, as indicated in FIG. 3B. Mobile ions can be detrimental to device operation by reducing or eliminating light production over a lifetime of operation. After the LED dies 60, 62, and 64 are placed and wire bonds 66 connecting them to the metal strips 4 on the package are formed, the tubs 6, 8, and 10 are then filled with encapsulant layers 72, 74, and 76. The encapsulant material may be mixed with a phosphor. The encapsulant is typically dispensed into the tubs from individual needle dispensers, a costly manufacturing process.

All of the LED dies 60, 62, and 64 emit light of a single dominant wavelength, blue light in this example. In the first tub 6, the first encapsulant layer 72 is mixed with a first phosphor that is excited by blue light and emits red light. In the second tub 8, the second encapsulant layer 74 is mixed with a second phosphor that is excited by blue light and emits green light. In the third tub 10, the third encapsulant layer 76 is not mixed with a phosphor. As described, this assembly with three operating blue light LEDs emits red light from the first tub 6, green light from the second tub 8, and blue light from the third tub 10. These three colors combine to produce white light. The intensity and hue of the resulting light can be adjusted by adjusting the current flowing through the individual LED dies 60, 62, and 64. The current is supplied to the individual LEDs by contact to the metal strips 4 to an outside source of electrical current. The LED dies 60, 62, and 64 are not in electrical contact with one another, and, as such, are individually addressable.

Many of these lead frame packages with LED dies are combined to make a BLU. A typical BLU for a flat panel display such as for a mobile phone may contain twenty or more of these lead frame packages, which may be arranged along the edges of a display to direct light into a diffuser plate, which illuminates the screen.

There is a need to make smaller BLUs for flat panel displays. The current lead frame package for the LED assembly that goes into a BLU is difficult to decrease in size due to the width of the sidewalls, the metal strips, and the need to leave room in the tub to place the LED die and form wire bonds.

It is also difficult to reduce the size of the LED die that goes into a lead frame package. Turning again to FIG. 2, an LED die is typically wire bonded to the metal lead frame package. In wire bonding, a metal wire, typically made of gold or copper, is spooled out with a metal ball at the head of the wire. The ball end of the wire is bonded to a metal contact 36 or 38 on the LED using force, time, ultrasonication, and heat. Present wire bonding technology requires the ball contact to have a largest dimension of at least 70 microns. The other end of the wire bond is called a wedge, and is similar in size to the ball end. The ball end is typically bonded to a metal contact 36 or 38 on the LED while the wedge end is bonded to a metal strip on the lead frame package. The metal contacts 36 and 38 on the LED and the metal strip on the lead frame package need to be larger than the 70 microns of the ball or wedge to allow some misalignment of the wire bond to either the metal contact of the LED or the metal strip of the lead frame package. Metal contacts 36 and 38, each with a largest dimension of, for example, 80 microns, constitute a significant fraction of the LED device size, and make it practically difficult to manufacture an LED die that will be wire bonded with sufficient usable light with an overall largest dimension less than 200 microns.

The combined LED die size and package size constitute a significant portion of the thickness of the flat panel display. Reducing the thickness of the flat panel display is advantageous for portable electronics such as smartphone and laptop computer display screens. In the previous example of a conventional LED assembly, the LED die may be 250 microns in either width 32 or length 34. The interior of each tub may measure 450 by 450 microns and the sidewalls of the lead frame package may be 100 microns thick. The lead frame package containing three 250×250 micron LED dies may then measure 650 microns wide by 1750 microns long (plan view), for a total area in plan view of 1,137,500 microns squared.

Discussion of the Present Invention

This discussion now turns to the present invention. A completed assembly will first be discussed. In the present invention, an assembly of LEDs which does not incorporate a lead frame package or wire bonds and is suitable for producing light is described. The assembly can be used as part of a BLU for a flat panel display. However, it should be recognized that the present invention can have a broad range of applications. Methods for forming an embodiment of the package-less LED assembly and integrating into a BLU are provided.

The assembly incorporates a plurality of LEDs on a single substrate. By eliminating the lead frame package, the form factor and the cost of the LED assembly are reduced compared to the prior art conventional assembly. Most of the manufacturing steps are completed simultaneously on thousands of assemblies on one substrate, which gives economy of scale to the process. By replacing wire bonds with wiring structures, which are patterned by lithography, the size of the metal contacts on the LED can be reduced, which, in turn, allows the size of the LED to be reduced. Wiring structures are made by conductive material deposition, patterning, and etching on a substrate containing thousands of assemblies simultaneously, which is faster and less costly than forming individual wire bonds. The LEDs are sealed by screen printing encapsulant layers onto thousands of assemblies on the substrate simultaneously, which is less costly than dispensing the material onto individual LED dies. Further, dividing pluralities of three or more LEDs from substrates containing thousands or millions of LEDs involves fewer "cuts" than dividing single LED dies from a similar substrate.

Figure 4A:
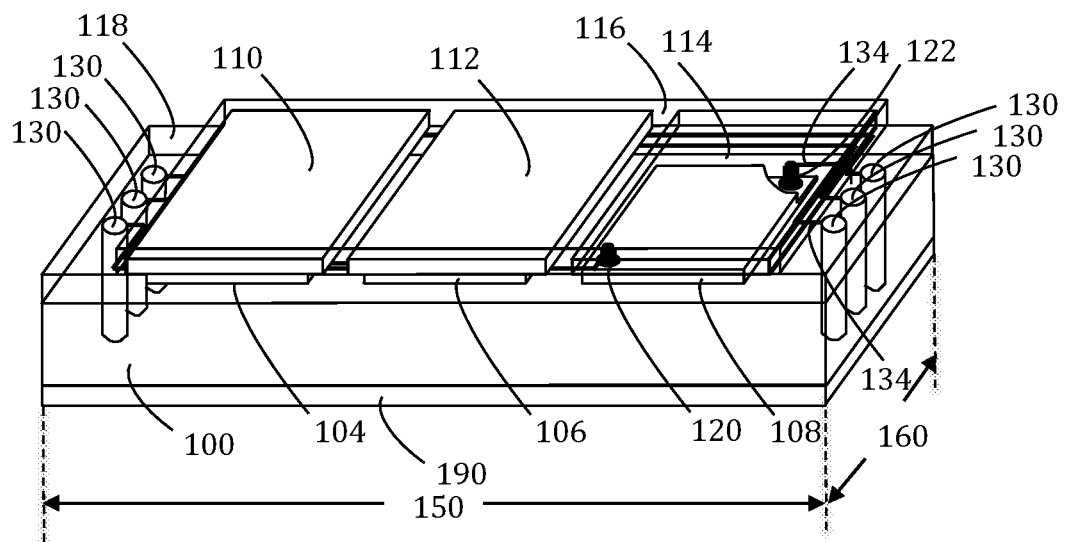
FIGS. 4A and 4B schematically illustrate an isometric and a cross sectional view, respectively, of an LED assembly according to an embodiment of the present invention.
Figure 4B:
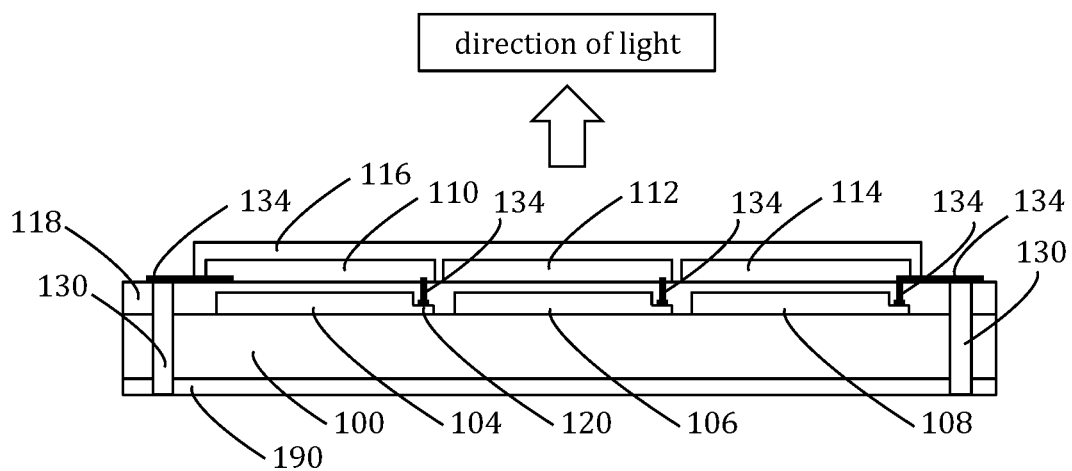

FIG. 4A shows one embodiment of the present invention in isometric view, and FIG. 4B is a cross sectional view. The drawings are not to scale, and the thickness of some layers may be exaggerated for clarity. Many of the elements of the assembly are transparent. A plurality of three LEDs 104, 106, and 108 are on the first side (frontside) of substrate 100. The LEDs 104, 106, and 108 all produce light with about the same dominant wavelength. It is to be understood that the present invention can have more than three LEDs, for example, four, five, six, twelve or more LEDs. Encapsulant layers 110, 112, 114, and 116 provide a barrier to mobile ions and help direct the light from the assembly, as shown in FIG. 4B. By incorporating phosphors into two encapsulant layers 110 and 112 but not in encapsulant layers 114 and 116 in this example, the assembly produces three different wavelengths of light, enabling white light production. A reflective layer 190, which is on the second side (backside) of the substrate 100 opposite the first side, reflects the light from LEDs 104, 106, and 108. Each LED has two conductive material contacts 120 and 122. Conductive material contacts 120 and 122 are not shown on LEDs 104 and 106 but can be seen in FIG. 4A on LED 108, which is overlaid with an encapsulant layer 114, which does not contain phosphor. One wiring structure 134 of a plurality of wiring structures connects to one conductive material contact 120 and another to conductive material contact 122 on each LED 104, 106, or 108, for a total of six wiring structures in this example. Wiring structures 134 have a largest size defined by lithography, and the largest size is much smaller than that for wire bonds formed by conventional methods, for example wire bonds 66 in FIG. 3B. Wiring structures 134 are also smaller than the metal strips in a lead frame package, for example metal strips 4 in FIG. 3A. One wiring structure 134 is connected to one wire 130 of a plurality of wires, for a total of six wires in this example. The wires extend through vias in a reflective layer 190, the substrate 100, and a dielectric layer 118. Electrical power to individual LEDs 104, 106, and 108 on the frontside of the assembly is supplied by contacting the wires 130 on the backside of the assembly to an outside source. Each LED 104, 106, and 108 of the assembly has an individual connection to its n-type and p-type layers so that each is individually addressable.

A completed discrete assembly, such as this example, results from its division from the thousands of other assemblies on the original substrate 100 after all other fabrication steps are completed, as will be discussed later.

In one embodiment, the LEDs used in this assembly may be 100 microns×100 microns in a largest dimension, or even smaller. Many other embodiments with different size and shaped LEDs are possible, including LEDs that are 500 microns×500 microns or larger and not square in plan view. For example, the LEDs may be 500 microns×500 microns, 10 microns×10 microns, or 50 microns width×200 microns length, all in plan view. An assembly with three 100 micron× 100 micron LEDs may have an overall dimensional length 150 (as shown in FIG. 4A) of 440 microns and width 160 of 140 microns long in plan view allowing spacing between the LEDs and for the wiring and wire structures, for a total area of 61,600 microns squared. Recall that the prior art assembly discussed earlier had package dimensions of 650 microns× 1750 microns in plan view, for an area of 1,137,500 microns squared. The LED assembly in this example made according to the present invention has a 95% smaller size in plan view than the previously described conventional assembly, and will be considerably thinner in cross section. This smaller size enables thinner flat panel displays. By performing most of the fabrication steps on thousands or millions of assemblies simultaneously, the cost is reduced compared to the previously described conventional assembly. Even smaller LED assemblies are possible in embodiments of the present invention. While smaller LEDs will produce less light than larger LEDs, it is often the case that large amounts of light are not required while smallest possible form factor is highly desirable.

A more detailed description of the embodiments of the invention now follows, including a description of fabrication methods. FIGS. 5A through 14 will detail methods of fabrication and FIGS. 15 to 19 will show various embodiments of the invention. Again, the figures are not to scale and some dimensions are exaggerated for clarity. LEDs are typically based on one or more pn or p-i-n junctions. While the conductivity type of the LED layer closest to the substrate is described herein as n-type and the opposite conductivity type is described as p-type, it should be understood that, throughout this discussion, these conductivity types may be reversed. GaN is used throughout this description for the LED semiconducting material, but any suitable semiconducting material may be used, including but not limited to GaP, AlGaAs, GaAsP, AlGaP, GaInP, InGaN, SiC, AlGaN, AlN, InN, or InP.

Figure 5A:
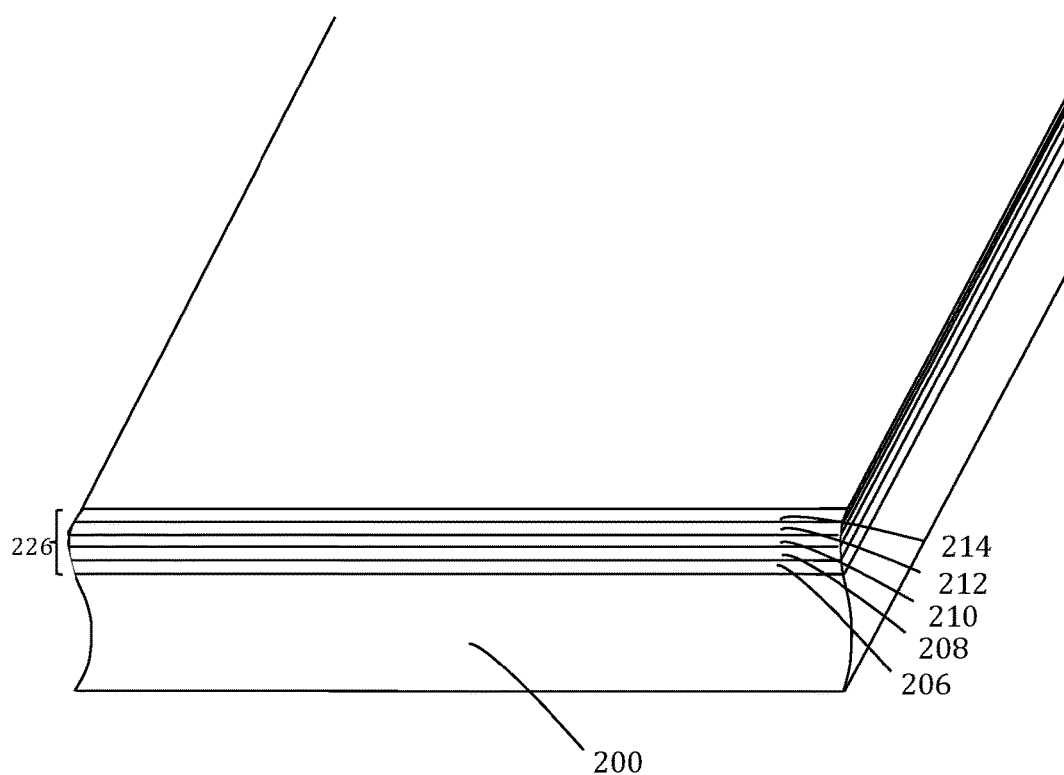
FIG. 5A schematically illustrates an isometric view of semiconductor layers and a transparent conductive layer according to embodiments of the present invention.

Turning to FIG. 5A, in one method, a group of LEDs are first fabricated on a substrate 200. The substrate 200 has a first surface and second surface, the second surface being opposite the first surface. The substrate upon which the GaN LEDs are fabricated is typically single crystal sapphire, although any suitable substrate material may be used, including but not limited to SiC, GaN, ZnO, and Si. The substrate should be made of single crystal material which is substantially crystal lattice matched with the semiconductor material of the LED. For example, GaN and sapphire are substantially crystal lattice matched, with a lattice mismatch of 16%. The substrate may be polished flat, or have some texture on the first surface (frontside) to enhance light scattering from the LEDs to be formed.

Any suitable individual LED fabrication as known in the art may be used in the methods of the present invention and the embodiment is just one example of materials and fabrication processes. In one embodiment, LEDs are fabricated on the substrate 200 by standard techniques to produce a group of LEDs. An LED consists of a stack 226 of semiconducting layers and conductive layers. In one embodiment, an undoped GaN layer 206 is first deposited on the substrate 200 by any suitable method, for example metal organic chemical vapor deposition (MOCVD) using trimethylgallium (TMG) and ammonia as precursors. Undoped GaN layer 206 may be 0.5 to 6 microns thick, most preferably about 2 microns. In other embodiments, a layer such as AlN (not shown) is first deposited on substrate 200 to help improve subsequent deposition of GaN. An n-type GaN layer 208 is deposited on top of undoped GaN layer 206 using TMG, ammonia, and a silicon source such as silane as precursors. The n-type GaN layer 208 may be 0.4 to 6 microns thick, most preferably about 2 microns thick. The quantum well layer 210 is deposited on top of n-type GaN layer 208. The quantum well layer is made of alternating sub-layers of InGaN and undoped GaN deposited on top of one another (sublayers not shown). Quantum well layer stack 210 begins and ends with an undoped GaN sub-layer. Quantum well layer 210 can be deposited with TMG, ammonia, and trimethylindium precursors. The composition and thickness of the sub-layers of quantum well layer 210 will determine the wavelength of light produced by the LED. In one embodiment, blue light emitting LEDs may have from one to ten quantum wells, most preferably five, where each quantum well is comprised of a InGaN sub-layer that is 30 to 500 angstroms thick, most preferably 70 angstroms thick, and an undoped GaN sub-layer that is 30 to 300 angstroms thick, most preferably 100 angstroms thick. The quantum wells are arranged such that each InGaN sub-layer is deposited on top of a GaN sub-layer, so that the InGaN and GaN sub layers alternate, and final layer of undoped GaN sub-layer completes the stack. A p-type GaN layer 212 is deposited on top of quantum well layer 210, and can be deposited with TMG and ammonia precursors, and a magnesium precursor, such as bis cyclopentadienyl magnesium ($Cp_2Mg$). The p-type GaN layer 212 can be 0.1 to 2 microns thick, most preferably 0.2 microns thick. As known to those skilled in the art, in other embodiments, there may be so-called current blocking layers (not shown) above and/or below quantum well layer 210 (i.e. the quantum well layer may be deposited on a current blocking layer, and a current blocking layer may be deposited on top of the quantum well layer). It is recognized that there are other methods that may be used to deposit LED semiconducting materials, including hydride vapor phase epitaxy, molecular beam epitaxy, or any other suitable method.

After LED semiconductor layers are deposited, the layers may be annealed to activate the dopants and improve light production. The anneal may be, for example, at 600 to 800° C. for 10 minutes to 4 hours, most preferably at 700° C. for 30 minutes.

Next, a transparent conductive layer 214, which may be indium tin oxide (ITO), aluminum zinc oxide, or a stack of very thin layers of nickel followed by gold, may be deposited on the p-type GaN layer 212, as shown in FIG. 5A. Transparent conductive layer 214 enables the electrical current to be distributed more evenly in the p-type GaN layer while allowing light to be transmitted through it. The transparent conductive layer 214 is generally more conductive than p-type GaN layer 212. If the LED is small enough, or p-type GaN layer 212 conductive enough, a transparent conductive layer 214 may not be needed. Transparent conductive layer 214 may be deposited by evaporation, CVD, or sputtering, most preferably evaporation. Transparent conductive layer 214 may be 0.05 to 1 micron thick, most preferably 0.2 microns thick for a conductive oxide like ITO, and 20 to 200 angstroms thick, most preferably 100 angstroms thick, for a stack of metals such as nickel and gold.

Figure 5B:
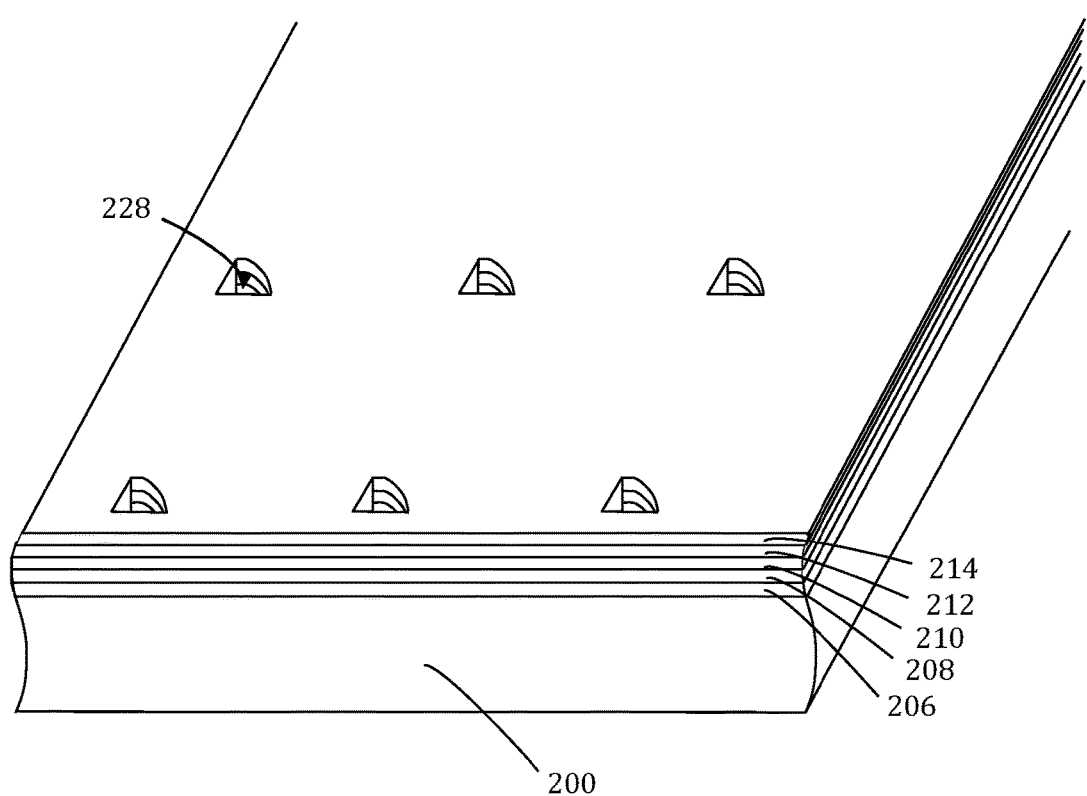
FIG. 5B schematically illustrates an isometric view of semiconductor layers and a transparent conductive layer with portions etched to enable a contact to the n-GaN layer as in embodiments of the present invention.

Turning to FIG. 5B, a masking layer, such as photoresist (not shown), is then applied and patterned, and a portion 228 of the transparent conductive layer 214, p-type GaN layer 212, quantum well layers 210, and some, though not all, of the n-type GaN layer 208 is then removed by etching in specific locations to create an n-contact area to the n-type GaN. These layers may be dry etched using chlorine gas. The masking layer is then removed.

Figure 5C:
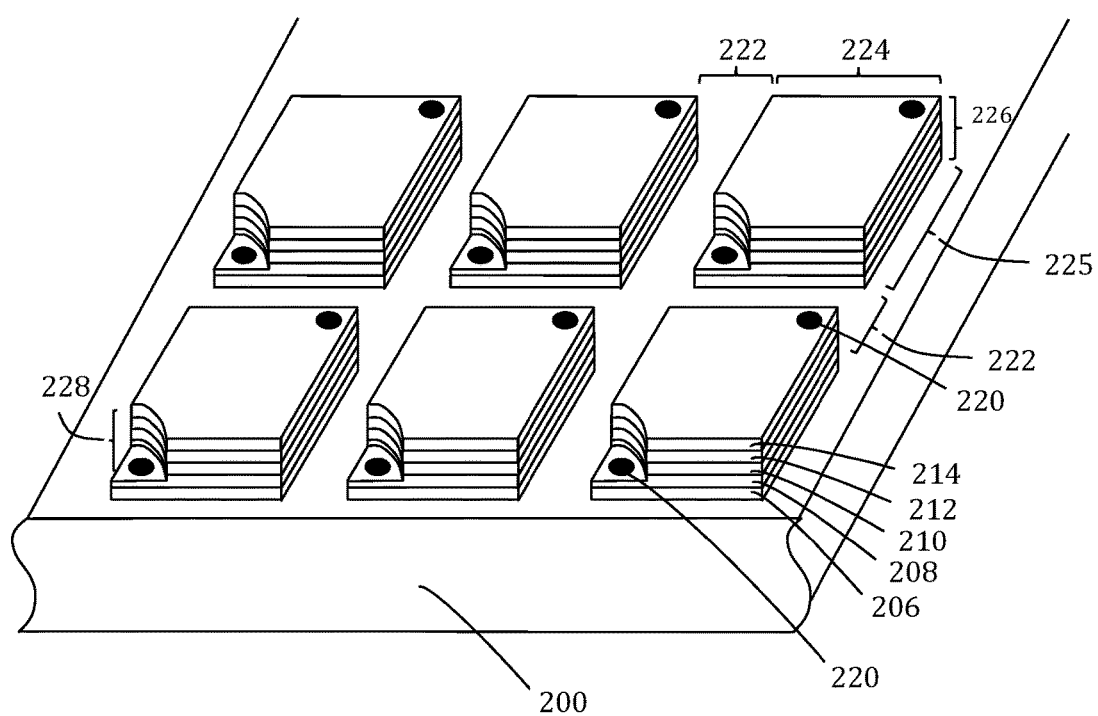
FIG. 5C schematically illustrates an isometric view of a plurality of LEDs on a substrate according to embodiments of the present invention.

Turning to FIG. 5C, a second masking layer, such as photoresist (not shown), is then applied and patterned in order to form discrete LEDs. Transparent conductive layer 214, p-type GaN layer 212, quantum well layer 210, n-type GaN layer 208, and undoped GaN layer 206 are then removed by etching to create gaps 222 in the semiconductor and conductive layer stack 226. (In some embodiments, a portion of the thickness of undoped GaN layer 206 remains) Gaps 222 exist between an LED and its nearest neighbor LEDs. Many thousands or millions of LEDs are fabricated simultaneously on a single substrate and are in immediate physical contact with substrate 200. The drawing is not to scale, and the thickness of the layers is exaggerated for clarity. Six LEDs are shown in FIG. 5C, though it is to be understood there are many thousands or millions of LEDs in the group of LEDs on substrate 200. Layers 206 through 214 may be dry etched using chlorine gas, or any suitable etchant. The second masking layer is then removed. The resulting gaps 222 may be any suitable size to insure that each LED is not in electrical contact with any other LED, for example between 1 and 200 microns, most preferably about 20 microns. The LEDs may any suitable size, for example a largest dimension 224 or 225 between 10 and 600 microns, most preferably about 100 microns. In a different embodiment, the gaps 222 between each LED of the group and its nearest neighbor are first formed, and removal of a volume 228 of layers to expose the contact area of n-type GaN layer 208 follows. The LEDs described most preferably emit blue light with a dominant wavelength of between 420 and 470 nm, although they can be fabricated to emit any suitable dominant wavelength.

First and second conductive material contacts 220 may overlie and be in electrical contact with n-type GaN layer 208 and with a portion of transparent conductive layer 214 or p-type GaN layer 212 if no transparent conductive layer 214 was deposited, and may have current spreading fingers (not shown). Current spreading fingers help to distribute the electrical current more evenly through the surface of the LED. The conductive material contacts 220 may be formed by one of two methods. One method is the subtractive approach, in which conductive material is first deposited, a masking layer (not shown) is then deposited and patterned on top of the conductive material contact layer, the conductive material is etched, and the masking material is removed. The second and preferred method is the liftoff approach. In the liftoff approach, masking material is first deposited and patterned. Conductive material is then deposited on top of the patterned masking material, and overlies both the patterning material and the underlying material where there is no patterning material. The masking material is then removed, which removes the conductive material overlying the masking material, but does not remove the conductive material deposited on the exposed underlying material. Conductive material contacts 220 may be deposited by evaporation, chemical vapor deposition (CVD), or sputtering, most preferably by evaporation. The conductive material contacts may be comprised of nickel, titanium, titanium nitride, aluminum, silver, or copper, or any suitable material. The conductive material contact may be between 0.2 to 6 microns thick, most preferably about 0.5 microns thick. The conductive material contacts may have any shape necessary in plan view, for example circular or square, and may have a largest dimension in plan view of between 1 and 100 microns, most preferably about 5 microns. The conductive material contact forms an ohmic contact with the semiconductor and/or transparent conductive layer it overlies. The patterned conductive material contact 220 may be annealed to improve its electrical contact with and/or adhesion to the layer underneath. The anneal may be at 300 to 800° C. for 10 minutes to 4 hours, most preferably 450° C. for 30 minutes. The anneal may create the ohmic contact. In other embodiments, no conductive material contacts 220 are fabricated and no post-patterning anneal is performed. In that case, a subsequently formed wiring structure will contact the LED and form an ohmic contact. In a yet another embodiment, conductive material contacts 220 are formed after the removal of a portion 228 of the layers above the n-contact areas but before the pattern and etch forming gaps 222 between the discrete LEDs.

Figure 6A:
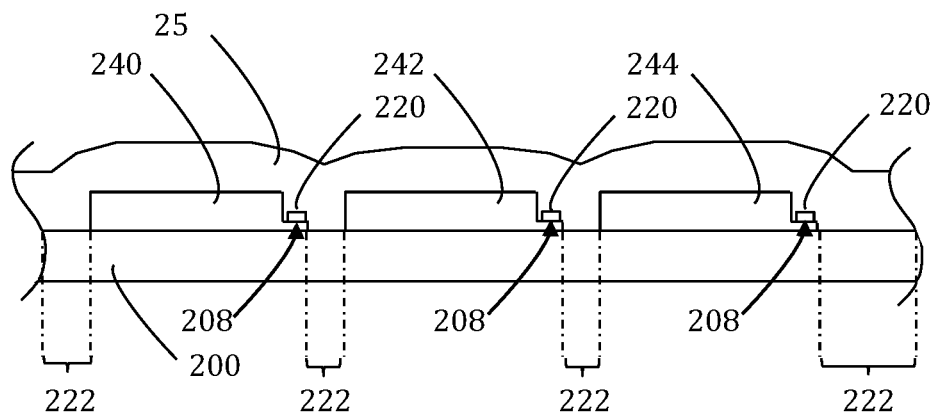
FIG. 6A schematically illustrates a cross sectional view of a group of LEDs with a dielectric layer overlying the LEDs that has not been planarized according to embodiments of the present invention.

Turning to FIG. 6A, after individual LEDs 240, 242, and 244 have been fabricated with gaps 222 separating the LEDs and conductive material contacts 220 formed, a dielectric layer 250 is deposited and overlies LEDs 240, 242, and 244 and conductive material contacts 220. Due to the location of the cross sectional view, only the conductive material contact 220 to the n-type GaN layer 208 is visible, although it is to be understood that there is a conductive material contact to the p-type GaN layer 212 or overlying transparent conductive layer 214 (shown in FIG. 5C). Dielectric layer 250 serves to electrically insulate portions of the LEDs from subsequent wiring structures and from other LEDs, to seal the LEDs from mobile ions, and to direct the light from the LEDs. While three LEDs 240, 242, and 244 are shown in FIGS. 6A to 14, it is to be understood that there are many thousands or millions of LEDs on substrate 200, and fabrication is occurring simultaneously on all of them. Dielectric layer 250 may be silicon oxide, titanium oxide, aluminum oxide, silicon nitride, a combination of these materials, or any other suitable material, and may be deposited by evaporation, sputtering, atomic layer deposition (ALD), or CVD, most preferably by CVD. In a specific embodiment, dielectric layer 250 is composed of silicon oxide deposited by CVD using silane and oxygen as precursors. If composed of silicon oxide, dielectric layer 250 may be 0.2 to 10 microns thick, most preferably about 0.5 microns thick.

Figure 6B:
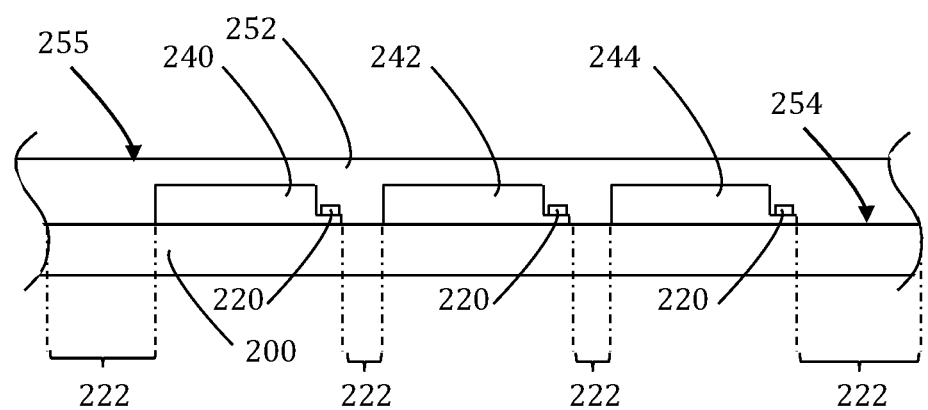
FIG. 6B schematically illustrates a cross sectional view of a group of LEDs with a dielectric layer overlying the LEDs that has been planarized.

In one embodiment, dielectric layer 250 is planarized after deposition. Turning to FIG. 6B, planarized dielectric layer 252 is shown in cross section. Planarization is the process by which the top surface 255 of layer 252 is rendered substantially parallel to first surface 254 of substrate 200 underneath. Planarization may be accomplished by any standard process, such as chemical mechanical planarization (CMP), non isotropic wet chemical etch, or plasma etch in corrosive gas, most preferably by CMP. Subsequent steps in fabrication will be described assuming that dielectric layer 250 of FIG. 6A has been planarized. It is to be understood that the fabrication could proceed without this planarizing step.

Figure 7:
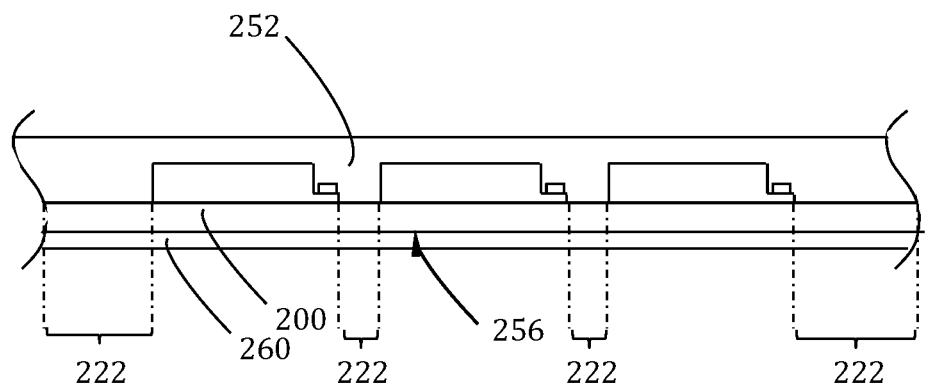
FIG. 7 schematically illustrates a cross sectional view of a group of LEDs, a dielectric layer, and a reflective layer.

Next, turning to FIG. 7, substrate 200 is mechanically thinned to a thickness of 40 to 300 microns, most preferably about 150 microns. Mechanical thinning may be accomplished by any standard process, such as grinding and polishing, and leaves the second surface 256 of substrate 200 smooth. A reflective layer 260 is then deposited, contacting the second surface 256 or backside of the thinned substrate 200. Reflective layer 260 reflects the light emitted by the LEDs, and helps direct it normal to the plane of the assembly in one direction, as shown in FIG. 4B for example. In this embodiment, reflective layer 260 may be titanium, silver or aluminum, or any suitable material. Reflective layer 260 may be deposited by any suitable method including evaporation, sputtering, or electroplating, most preferably by evaporation. In a different embodiment, reflective layer 260 may be a distributed Bragg reflector (DBR), which is includes one or more pairs of dielectric layers (not shown). Each dielectric layer in a pair has a different index of refraction. The dielectric layers of the DBR may be deposited by any suitable method, including evaporation, sputtering, CVD, or ALD, most preferably by evaporation. The thickness of each dielectric layer in the DBR is designed to be about one quarter of the wavelength of light that is to be reflected. The wavelength of light varies with the index of refraction of each material. For example, for LEDs that emit blue light with a wavelength from 440 to 460 nm, a suitably reflective DBR would be comprised of one to ten, most preferably five, pairs of aluminum oxide (index of refraction is 1.5 to 1.7) and titanium oxide (index of refraction is 2.3 to 2.7) layers, where the aluminum oxide layer is 670±70 angstroms thick and the titanium oxide layer is 490±50 angstroms thick. A reflective layer that is a DBR may be silicon oxide, silicon nitride, aluminum oxide, tantalum oxide, or titanium oxide, or any other suitable dielectric material. Reflective layer 260 is most preferably a DBR. In other embodiments, a reflective layer is not deposited on thinned substrate 200.

Figure 8:
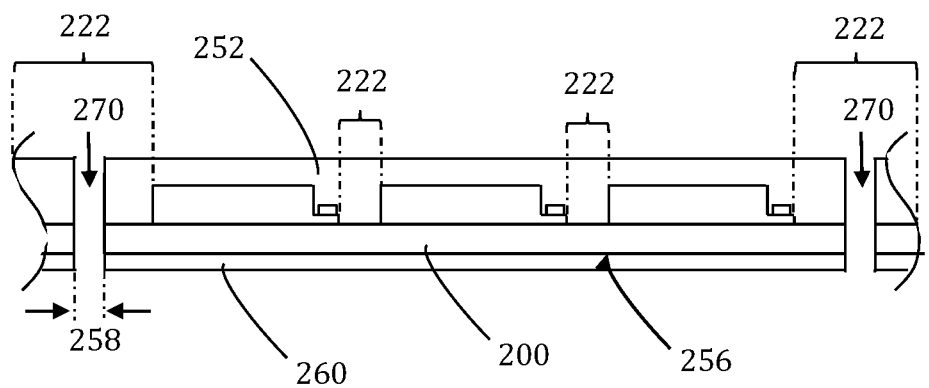
FIG. 8 schematically illustrates a cross sectional view of a group of LEDs, a dielectric layer, a reflective layer, and vias with wires according to embodiments of the present invention.

As shown in FIG. 8, after deposition of reflective layer 260, a plurality of vias 270 are formed through reflective layer 260, substrate 200, and dielectric layer 252. Vias 270 preferably do not transit the LEDs and are formed in gaps 222 between LEDs. The gaps 222 may vary in size. For example, the gaps between adjacent LEDs within one assembly may be smaller than the gap between two adjacent assemblies. The gaps between LEDs of Vias 270 may have a diameter 258 that can be from 2 to 100 microns, resulting in a cross sectional area, where the cross section is about parallel to the second surface 256 of the substrate, of between 10 and 7500 microns squared assuming the vias have a circular cross section though this cross section may have some other shape. Vias 270 can be formed by applying a masking layer and etching, or by laser ablation, most preferably by laser ablation. During laser ablation, short pulses of laser light are used to remove material. In one embodiment, a laser of wavelength 355 nm with pulses lasting nanoseconds or picoseconds is focused to a spot size of 10 microns in diameter. The laser is aimed at the backside of the structure and as many pulses are applied as needed to remove portions of reflective layer 260, substrate 200, and dielectric layer 252, by rastering the laser to different locations to create a via. This step is repeated for as many vias 270 as are required. In general, for individually addressable LEDs, two vias 270 per LED are fabricated, although more or less may be fabricated. In FIG. 8, only two vias 270 are visible due to the location of the cross section, but it is to be understood that there are more vias 270 in front of the visible ones. Multiple lasers may engage simultaneously to increase throughput. For embodiments without a reflective layer, only portions of substrate 200 and dielectric layer 252 are removed to form vias 270.

Figure 9:
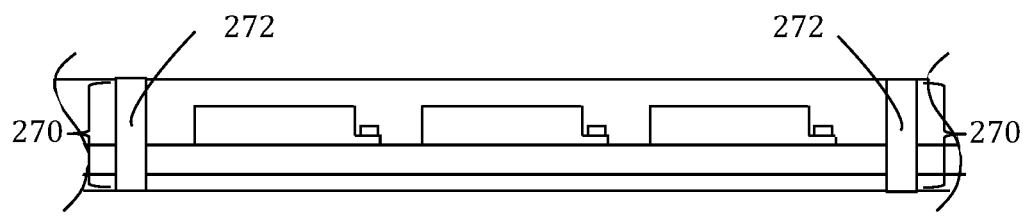
FIG. 9 schematically illustrates a cross sectional view of a group of LEDs, a dielectric layer with open regions, a reflective layer, and vias.

Turning to FIG. 9, after the vias are formed, a plurality of wires 272 that extend substantially through each respective via of the plurality of vias is formed. Wires 272 may fill vias 270 in whole or part with a metal layer or metal layer stack, such as tantalum, tantalum nitride, and copper, or titanium, titanium nitride, and tungsten, or a conductive semiconductor such as doped polycrystalline silicon. For partly-filled vias 270, the wire may coat the sidewalls of the via, leaving an unfilled gap in the center of the via. It is not necessary for the wire to completely fill the via, only that the wire extend substantially from one opening of the via to the other opening.

Figures 10A, 10B, 10C:
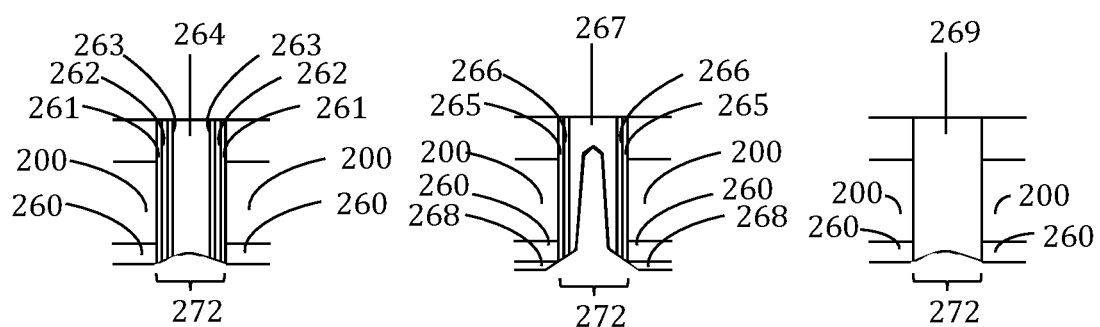
FIGS. 10A, B, and C schematically illustrate a cross sectional view of a via filled with (A) a copper wire, (B) a tungsten wire, and (C) a polysilicon wire.

In one embodiment of a wire 272, shown in cross section in FIG. 10A, thin layers of tantalum 261, tantalum nitride 262, and copper 263 are deposited by sputtering onto the sidewall of a via. The layers are also deposited onto reflective layer 260 (or the backside of substrate 200 if there is no reflective layer 260), and are removed from these layers in a subsequent step. Tantalum layer 261, tantalum nitride layer 262, and copper layer 263 may each be 10 to 3000 angstroms thick, most preferably about 300 angstroms thick. These thin layers may be deposited by any suitable method, most preferably sputtering. A thicker layer of copper 264 is then deposited on thin copper layer 263 by electroplating. Thicker copper layer 264 may be any thickness necessary to conduct the necessary electrical current and/or extend from one opening of a via to the other opening. Thicker copper layer 264 may be from 0.5 to 100 microns thick, most preferably about 10 microns. In FIG. 10A, thicker copper layer 264 is shown completely filling the via but in other examples in may not completely fill the via.

Thicker copper layer 264 and thinner layers 261-263 are then selectively removed from reflective layer 260 (or backside of substrate 200 if there is no reflective layer 260) by CMP, leaving the metals intact inside the vias, as shown in FIG. 10A. The CMP process leaves layers 261-264 slightly recessed from the opening in the outer surface of reflective layer 260 due to dishing, but still extending substantially through the via. In a different embodiment, the metal layers 261-264 that will form the wire are selectively removed from reflective layer 260 by etching, leaving some or all of the conductive materials in the via. In yet another embodiment, a sacrificial layer such as silicon oxide (not shown in FIG. 10A) is deposited on reflective layer 260 prior to via or wire 272 formation. The sacrificial layer serves to protect reflective layer 260 and/or substrate 200 from damage during wire 272 formation. After the via is formed and the metal or conductive semiconductor layers forming wire 272 are removed from the sacrificial layer by CMP or etching, the sacrificial layer is removed in whole or in part by CMP or etching.

In a different embodiment shown in cross section in FIG. 10B, thin layers of titanium 265, titanium nitride 266, and a thick layer of tungsten 267 form wire 272. The titanium layer 265, titanium nitride layer 266, and tungsten layer 267 can be deposited by sputtering or CVD, most preferably by sputtering for titanium layer 265 and titanium nitride layer 266, and by CVD for tungsten layer 267. Wire 272 exists mostly on the sidewall or sidewalls of the via with a vacant core. This embodiment includes sacrificial layer 268, which may be silicon oxide. Layers 265-267 overlying sacrificial layer 268 have been removed by an etchback process, and some of sacrificial layer 268 remains.

In yet a different embodiment shown in cross section in FIG. 10C, doped polysilicon layer 269 deposited by CVD forms wire 272 in a via, and doped polysilicon layer 269 overlying reflective layer 260 has been removed by a CMP process. These are only three examples of wire shapes and processes, and other wires shapes and processes are possible.

Figure 11:
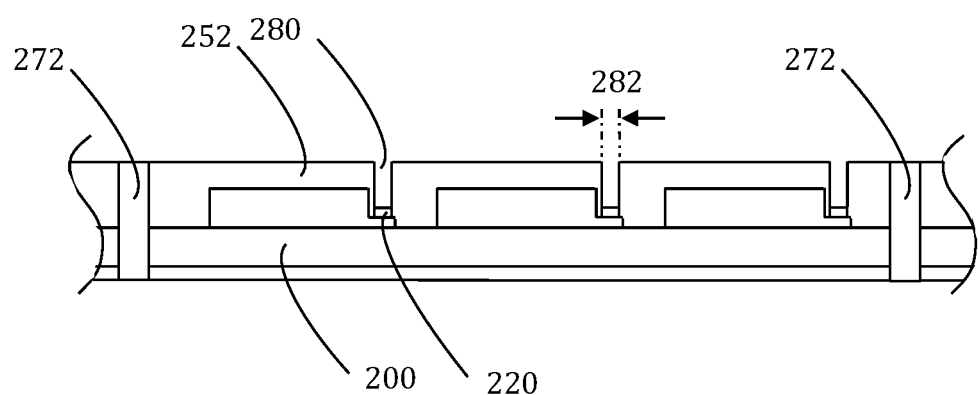
FIG. 11 schematically illustrates a cross sectional view of a group of LEDs, a dielectric layer with open regions, a reflective layer, and vias with wires according to embodiments of the present invention.

Turning to FIG. 11, after wire 272 formation, open regions 280 in dielectric layer 252 are fabricated. Open regions 280 are generally cylindrical in shape with the length of the cylinder perpendicular to substrate 200. However, open regions 280 may be any shape that exposes some portion of conductive material contact 220. Open regions 280 are made in the planarized dielectric layer 252 overlying each LED, exposing portions of each LED. Due to the location of the cross sectional view in FIGS. 11, 13, and 14, only one of two open regions 280 per LED is visible, although two open regions per LED exist. The open regions expose the conductive material contacts 220 on the LEDs. It will be recalled that each LED has two conductive material contacts 220, as shown in FIG. 5C. Turning back to FIG. 11, to make open regions 280, a masking layer, such as photo-resist (not shown), is applied and patterned, and dielectric layer 252 is etched. Etching may be accomplished by wet etching using a liquid acid such as HF, or dry etching using a fluorine or chlorine-based gas, such as $CF_4$, $SF_6$, or $Cl_2$, or any other suitable etchant, most preferably by dry etching with chlorine gas. The masking layer is removed after etching is complete. Open regions 280 have a cross sectional area parallel to the first surface of substrate 200 that can be 0.2 to 50 microns in diameter 282, most preferably about 5 microns in diameter. Open regions 280 will have a cross sectional area preferably less than about 25 microns squared.

Figure 12:
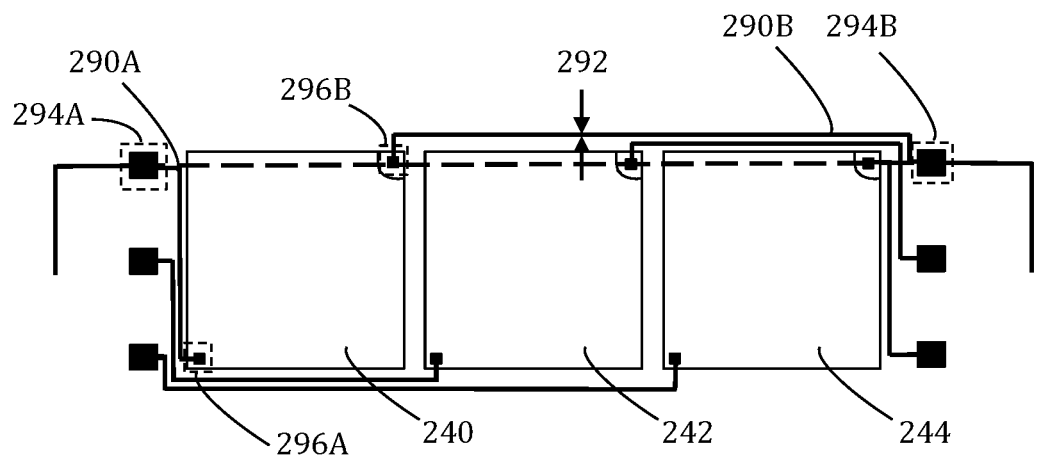
FIG. 12 schematically illustrates a plan view of LEDs, a dielectric layer, wiring structures, and wires according to embodiments of the present invention.

Turing to FIG. 12, which shows the structure in plan view, after open regions 280 in dielectric layer 252 are formed, a plurality of wiring structures 290 are formed. There are two wiring structures 290 per LED shown in this embodiment. The two wiring structures 290A and 290B that electrically connect LED 240 are discussed in detail. Note that when this discussion uses reference number 290, it refers collectively to 290A and 290B as shown in FIG. 12. It is to be understood that similar relationships exist between wiring structures 290 and LEDs 242 and 244. LED 240 is electrically connected to wiring structures 290A and 290B. Wiring structure 290A has a wire contact portion 294A which is in electrical contact with a wire (not visible in FIG. 12 underneath wire contact portion 294A) and an LED contact portion 296A which is in electrical contact with the transparent conductive layer of LED 240 or the p-type GaN layer of LED 240 if there is no transparent conductive layer. Wiring structure 290B has a wire contact portion 294B which is in electrical contact with a wire (not visible in FIG. 12 underneath wire contact portion 294B) and an LED contact portion 296B which is in electrical contact with conductive material contact 220 (not visible in FIG. 12 underneath LED contact portion 296B).

As shown in FIG. 12, wiring structures 290 may be 0.1 to 20 microns wide at their narrowest portion 292 as seen in plan view, most preferably about 1 micron wide, to carry the current necessary for the operation of LED 240. The conductive material that comprises wiring structures 290 may be any thickness suitable for adhesion to the underlying layers and to carry the current necessary for the operation of LEDs 240, 242, and 244, for example, between 0.2 and 5 microns thick, most preferably about 0.5 microns thick.

Figure 13:
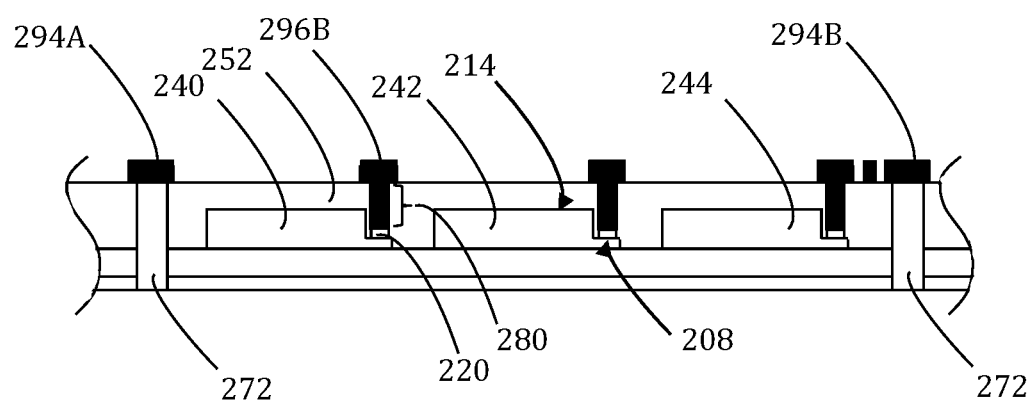
FIG. 13 schematically illustrates a cross sectional view of a group of LEDs, a dielectric layer with open regions, a reflective layer, vias with wires, and wiring structures.

A cross sectional view is shown in FIG. 13. The location of the cross sectional view is shown by the dotted line in the plan view of FIG. 12. Due to the location of the cross section in FIG. 13, only portions of four wiring structures 290 are visible although it is to be understood that there are six wiring structures in this embodiment. Turning to the two wiring structures 290A and 290B that contact LED 240, wire contact portions 294A and 294B are in electrical contact with wires 272 underneath. The wiring structure with LED contact portion 296A that is in electrical contact with either transparent conductive layer or p-type GaN layer if there is no transparent conductive layer of LED 240 is not visible in FIG. 13 due to the location of the cross section. Wiring structure 290B has LED contact portion 296B that fills open region 280 and is in electrical contact with conductive material contact 220, which contacts the n-type GaN layer of LED 240. Note that portions of four wiring structures are shown in FIG. 13 and are unlabeled. These structures are unlabeled to simplify discussion. Similar relationships exist between wiring structures 290 and LEDs 242 and 244. Wiring structures 290 may be formed by any of several methods, but are not made by wire bonding. One method is the subtractive approach, in which conductive material is first deposited, a masking layer is then deposited and patterned, the conductive material is etched, and the masking material is removed. The second method is the liftoff approach. In the liftoff approach, masking material is first deposited and patterned. Conductive material is then deposited, and overlies both the patterning material and the underlying material where there is no patterning material. The masking material is then removed, which removes the conductive material overlying the masking material, but does not remove the conductive material that does not overly the masking layer. In either the subtractive or liftoff approach, a cleaning step which removes nonconductive material from the wires 272 or conductive material contacts 220 may be employed to improve the subsequent contact between the wire and wire structure and between the conductive material contact and wire structure. This cleaning step may be a sputter etch using argon. While these are the two most common methods to form wiring structures 290, any other suitable method, such as direct write metallization or a damascene approach, may be used. The wiring structures are most preferably formed by the subtractive approach.

The wiring structures 290 may be any suitable material that makes an ohmic contact to the wires and conductive material contacts 220 of the LEDs, or to the n-type semiconductor layer and transparent conductive layer 214 of the LED, if there are no conductive material contacts 220. The wiring structures 290 may be titanium, tantalum, tungsten, tantalum nitride, titanium nitride, aluminum, copper, nickel, silver, or gold, or suitable alloys of the same. Wiring structures 290 may be a suitable stack of layers, for example a first layer of titanium to enable an ohmic contact and adhesion to the underlying layer, and a thicker second layer of aluminum overlying the titanium to shunt electrical current. The titanium layer in this example may between 0.01 and 0.5 microns thick, most preferably about 0.02 microns thick, and the aluminum layer may be between 0.1 and 5 microns thick, most preferably about 0.5 microns thick. The conductive material may be deposited by any suitable process, such as sputtering or evaporation, most preferably by evaporation.

Figure 14:
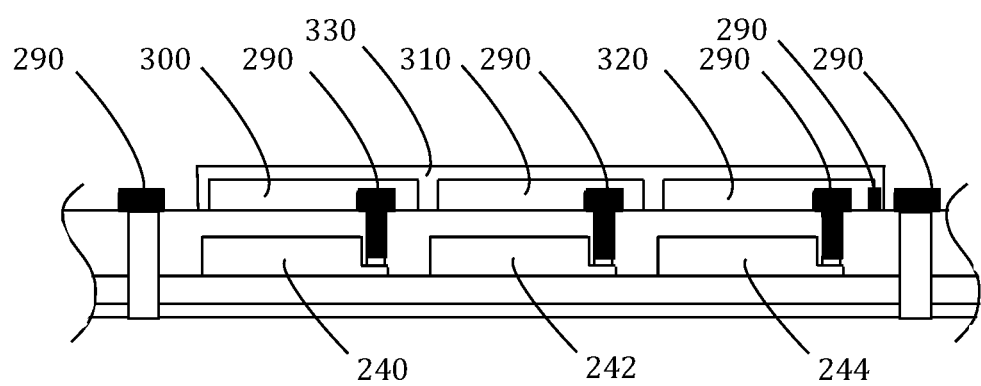
FIG. 14 schematically illustrates a cross sectional view of a group of LEDs, a dielectric layer with open regions, a reflective layer, vias with wires, wiring structures, and encapsulant layers.

Turning to FIG. 14, after wiring structures 290 are fabricated, the partially fabricated assemblies are then coated with encapsulant layers 300, 310, 320, and 330. Again, thousands or millions of assemblies are being fabricated simultaneously on one substrate. Each encapsulant layer is coated on these assemblies in one operation. Each encapsulant layer may be mixed with a phosphor, to make a phosphor-containing encapsulant layer. Encapsulant layers 300, 310, 320, and 330 seal LEDs 240, 242, and 244 against intrusion from mobile ions, directionalize the light from the LEDs, and, if they contain a phosphor, will transform the wavelength of light emanating from the LED underneath to a different wavelength that emanates from the assembly. In the typical embodiment shown in FIG. 14 with three LEDs 240, 242, and 244 that emit light with similar peak wavelength, two of the four encapsulant layers will contain a phosphor and the other two will not contain a phosphor. However, in other embodiments, there may be more or less than three LEDs and there may be more or less encapsulant layers, each of which may or may not contain a phosphor. Encapsulant layers 300, 310, 320, and 330 may be silicone, epoxy, or polycarbonate, or any suitable material, most preferably silicone. Encapsulant layers 300, 310, 320, and 330 are deposited by any suitable technique, most preferably by screen printing. During screen printing, the encapsulant and phosphor mix is transferred to the layer underneath through open areas of a stencil mask by a squeegee. In this manner, the encapsulant layers are selectively deposited in specific locations. The deposited encapsulant layer is dried and may be annealed. It may be annealed at 70 to 300° C. for 2 minutes to 3 hours, most preferably at 150° C. for 30 minutes. Multiple screen printings may be necessary to produce a single layer of suitable thickness. For example, a first encapsulant layer 300 in FIG. 14 may be fabricated by multiple screen printings, the second encapsulant layer 310 may be fabricated by additional multiple screen printings, etc. The layer may be annealed after each screen printing, or a single anneal may be performed after all screen printings have been completed. Most preferably, there is an anneal after each screen printing. Each encapsulant layer may be between 10 and 1000 microns thick, most preferably about 100 microns thick.

Figure 15:
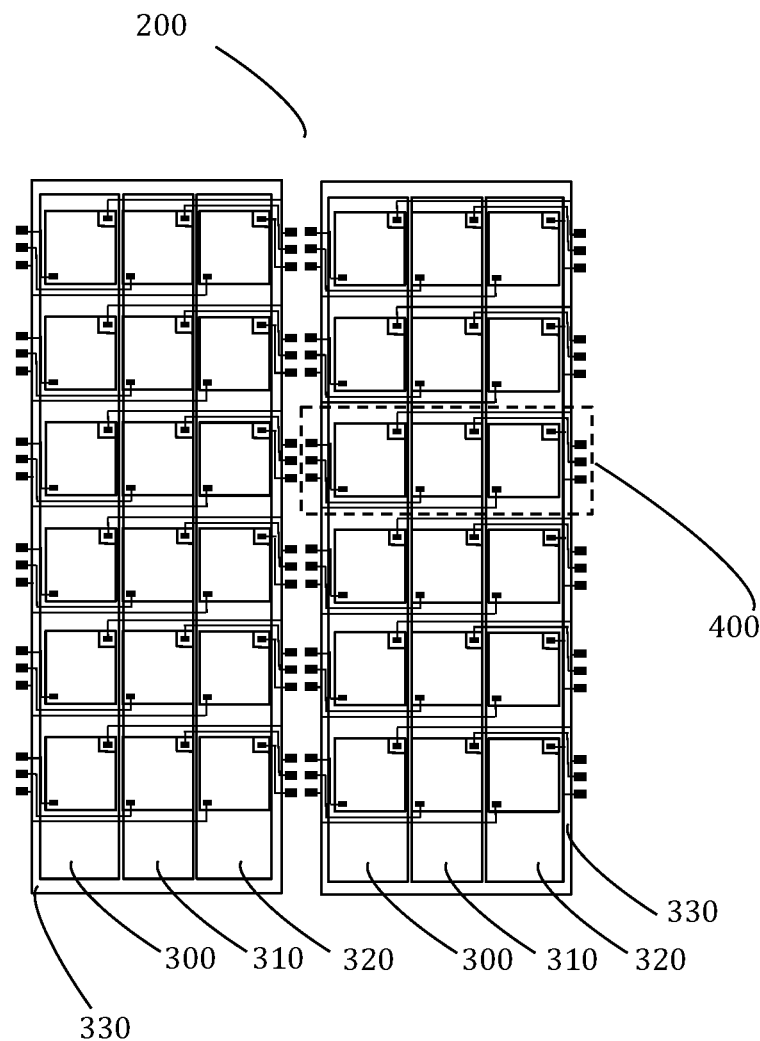
FIG. 15 schematically illustrates a plan view of a substrate with many assemblies of LEDs, prior to division of said assemblies.
Figure 16:
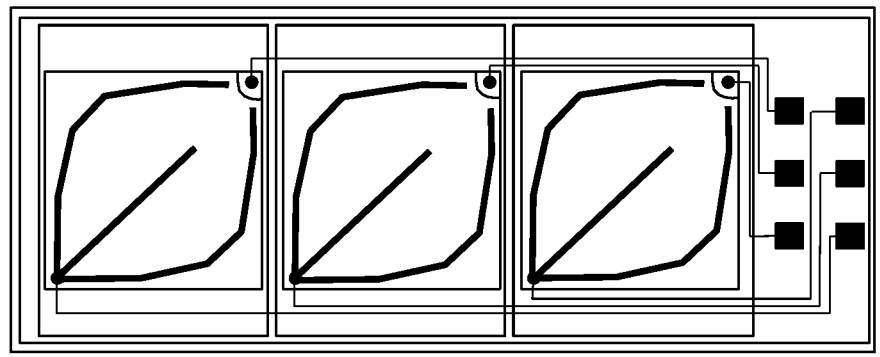
FIG. 16 schematically illustrates another embodiment of the invention in plan view with the wires placed to one side of the plurality of LEDs.
Figure 17:
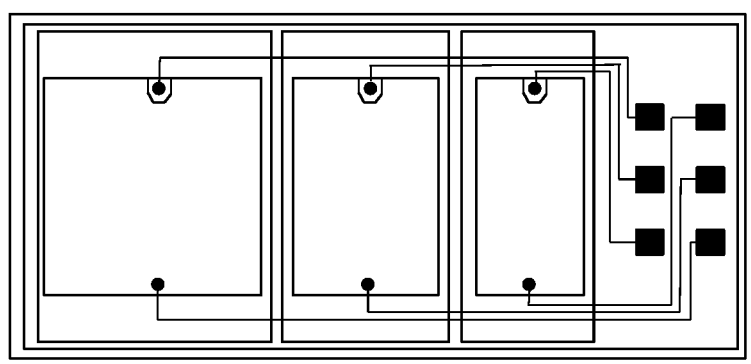
FIG. 17 schematically illustrates another embodiment of the invention in plan view with the LEDs having different sizes.
Figure 18:
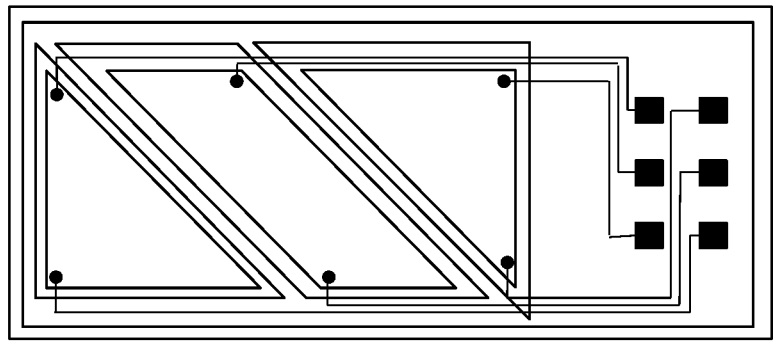
FIG. 18 schematically illustrates another embodiment of the invention in plan view with the LEDs having three different shapes and three different sizes.
Figure 19:
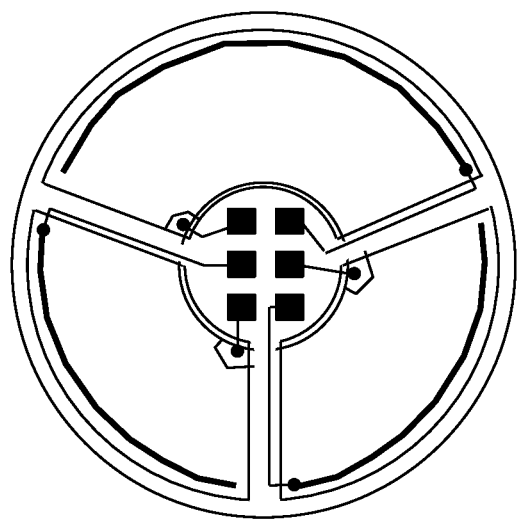
FIG. 19 schematically illustrates another embodiment of the invention in plan view with the LEDs having annular shapes, and the wires placed in between the LEDs.
Figure 20:
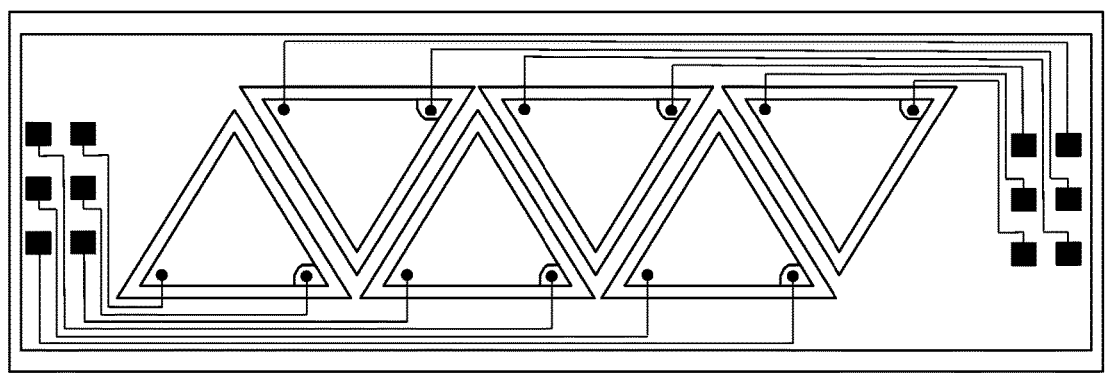
FIG. 20 schematically illustrates another embodiment of the invention in plan view of six triangle-shaped LEDs with wires placed to one side of the row of LEDs.

FIG. 15 shows a plan view schematic of 12 assemblies with encapsulant layers analogous to the cross section of one assembly with encapsulant layers shown in FIG. 14. Substrate 200 with 12 LED assemblies is shown, prior to the final step of dividing the assemblies; it will be understood that in practice there will normally be many more assemblies fabricated at one time. A single assembly 400 is identified for clarity. The first three encapsulant layers 300, 310, and 320 have been deposited in the pattern of columns overlying the group of LEDs as seen in plan view, and the fourth encapsulant layer 330 is in the pattern of a column which is wider than and overlies the first three encapsulant layers 300, 310, and 320. The screen printing of the encapsulant layers may take other patterns such as rows, checkerboard, alternating diamonds, or any other suitable pattern. As many different encapsulant layers and phosphors that are needed to produce the desired wavelength(s) of light from the final assembly and seal the LEDs may be applied, for example two, three, four, or five or more different encapsulant layers. In other embodiments, encapsulant layers with different concentrations of phosphors or kinds of phosphors may overlie one another, as will be understood by those skilled in the art.

In the embodiment shown in FIG. 14, in a first screen printing, a first encapsulant layer 300 with a first type of phosphor may be deposited to overlie fewer than all of the LEDs of the group on the substrate, for example, about ⅓ of the group of LEDs, but at least two LEDs. When it is described that a phosphor overlies an LED, the phosphor will generally overlie the entire area of the LED, but may also only overlie a portion. Recall that at this step in fabrication, the encapsulant layers are being coated onto thousands or millions of assemblies simultaneously. In a specific embodiment, first encapsulant layer 300 may be silicone and a first phosphor GaAlN, and the first phosphor is excited by light with a dominant wavelength of between 420 and 470 nm (blue) and emits light with a dominant wavelength of between 500 and 550 nm (red). In a second screen printing, second encapsulant layer 310 which may be silicone and a second phosphor may be coated to overlie fewer than all LEDs of the group on the substrate, and to different LEDs than the first screen printing, for example about ⅓ of all the LEDs of the group on the substrate, but at least two LEDs. This second phosphor may be comprised of CaAlSiN:Eu and the second phosphor is excited by light with a dominant wavelength of between 420 and 470 nm (blue), and emits light with a dominant wavelength of between 610 and 730 nm (green). In a third screen printing, third encapsulant layer 320 which may be silicone without phosphor may be coated to overlie fewer than all the LEDs of the group on the substrate and to different LEDs than first and second encapsulant layers 300 and 310, for example about ⅓ of all the LEDs of the group on the substrate. In a fourth screen printing, fourth encapsulant layer 330 which may be silicone without phosphor may be coated to overlie at least one to all of the LEDs on the substrate. In this embodiment, first encapsulant layer 300 overlies LED 240, second encapsulant layer 310 overlies LED 242, third encapsulant layer 320 overlies LED 244, and fourth encapsulant layer 330 overlies LEDs 240, 242, and 244 of each assembly in the group. All of the assemblies of the group may be annealed at 70 to 300° C. for 2 minutes to 3 hours, most preferably at 150° C. for 30 minutes, after the deposition of each encapsulant layer. In a different embodiment, the stack of encapsulant layers may be cured simultaneously after multiple encapsulant layer depositions.

In summary, in this embodiment, the first and second encapsulant layers are phosphor-containing layers, and the third and fourth encapsulant layers do not contain phosphors. The first encapsulant layer 300 will emit green light, the second encapsulant layer 310 will emit red light, and the third encapsulant layer 320 will emit blue light. These three colors combine to produce white light.

Each assembly may include more than three LEDs, for example five LEDs. For example, in an embodiment with five blue-light-emitting LEDs, the assembly may have two phosphor-containing layers that emit green light, two phosphor-containing layers that emit red light, and one encapsulant layer without a phosphor that emits blue light. In other embodiments, the LEDS may emit colors other than blue, such as red or violet, and the phosphor-containing layers may emit light with wavelengths other than red, green, or blue, for example they may emit cyan, violet, or yellow. The assembly may emit two, three, four, or more different wavelengths of light.

After fabrication of the assemblies is complete but prior to dividing, the individual assemblies are tested and "binned" for light output whilst the assemblies are still together on the substrate as shown in FIG. 15. A computer log stores the information from the test, correlated to the individual assembly location on substrate 200.

After test of the assemblies, the multiple assemblies on the substrate are divided into individual discrete assemblies. The assemblies are divided from one another by any of standard methods after thinning, such as sawing, laser ablation, or, most preferably, mechanical force after introduction of defects in the substrate by laser light, which results in the assemblies being separated at the location of the defects. After division, the assemblies are now completed assemblies, each with a plurality of LEDs. The area of the first surface of the substrate is less than 50 mm$^2$ for each completed assembly. The individual assemblies can then be transferred into BLUs for integration into a flat panel display.

In the preceding example, we have described a novel LED assembly with three square LEDs of the same size, and wires at either end of the row of LEDs, as shown in FIGS. 4A and 4B. However, it is to be understood that in the present invention there are many possible numbers of LEDs in the assembly, including but not limited to 3, 4, 5, 12, or any other number of LEDs. There are also many possible shapes of LEDs in the assembly, including but not limited to squares, rectangles, triangles, octagons, and circles when viewed in plan view. There are also many possible arrangements of the LEDs and wires within the assembly. The LEDs in one assembly according to the present invention may not necessarily be the same size or shape. Several examples of LED shape, LED size, LED placement, and wire placement for an assembly according to the present invention are shown in FIGS. 16 to 20, all in plan view. In an embodiment shown in FIG. 16, an assembly has three LEDs with current spreading fingers. The wires are all placed opposite to one side of the LEDs in the assembly (not visible underneath the wiring structures). A different embodiment shown in FIG. 17 has three LEDs with different sizes. A different embodiment shown in FIG. 18 has three LEDs with disparate sizes and shapes. A different embodiment shown in FIG. 19 has three irregular-shaped LEDs with the wires placed in the center of the assembly. A different embodiment shown in FIG. 20 has six triangle-shaped LEDs with the wires placed on either side of the row of LEDs.

Figure 21:
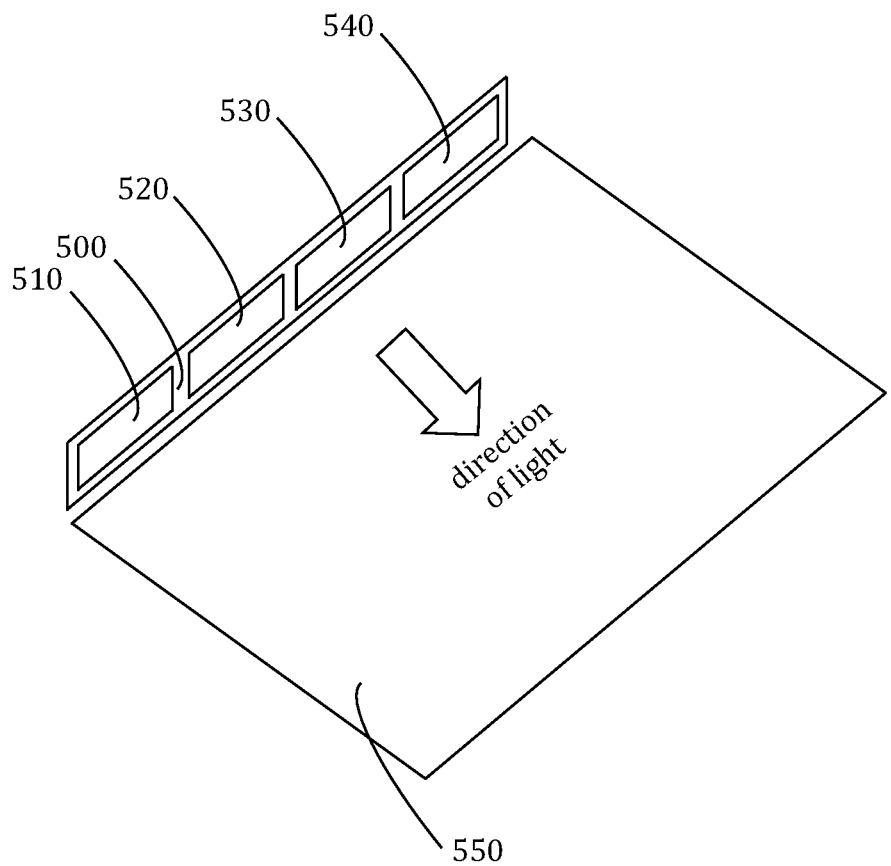
FIG. 21 schematically illustrates an isometric view of a BLU with a light guide.

The completed assemblies can be integrated into a BLU. There are two kinds of BLUs: a light guide arrangement and a direct backlight. An example of a light guide arrangement that incorporates the present invention is shown in FIG. 21. The BLU directs light into the light guide plate 550. Four assemblies of LEDs 510, 520, 530, and 540 according to the present invention are attached to a panel 500, although there are typically many more assemblies. In this example, the LED assemblies are at one edge of the light guide plate 550, but the assemblies may be at two, three, or more edges of the light guide plate on several panels.

Figure 22:
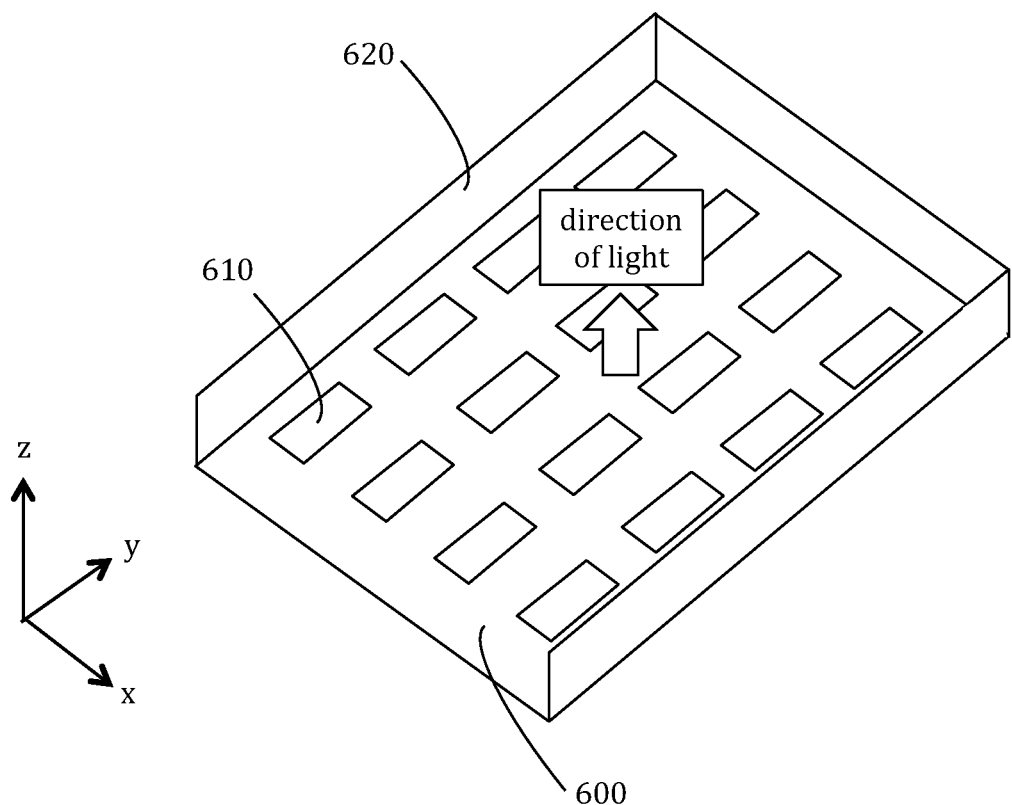
FIG. 22 schematically illustrates an isometric view of a BLU with a direct backlight.

An example of a direct backlight that incorporates the present invention is shown in FIG. 22. The LED assemblies 610 according to the present invention are attached to a panel 600, directing light in the z direction, as indicated by the arrow. The sidewalls 620 of the BLU help direct the light in the z-direction as indicated in FIG. 22 by reflecting light emitted in the x and y directions from the LEDs.

The panels (500 or 600 in FIGS. 21 and 22, respectively) for either a light guide arrangement or a direct backlight arrangement may be a printed circuit board (PCB). A PCB mechanically supports and electrically connects the LED assemblies to power sources using conductive tracks, pads, and other features etched from copper sheets laminated onto a nonconductive substrate.

Figure 23:
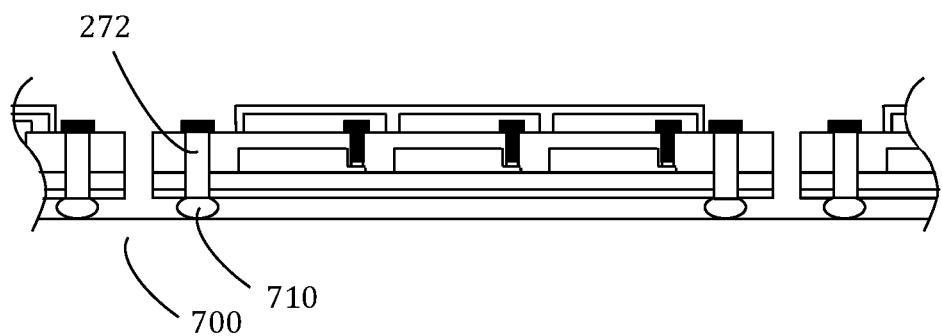
FIG. 23 schematically illustrates a cross sectional view of a BLU where assemblies of LEDs join to the panel.

The assembly according to the present invention may be attached to the PCB by ball or stud bumps, copper paste, or copper-copper direct bonding. In one embodiment, as shown in FIG. 23, solder ball bonds 710 on the PCB 700 are adhered to the wires 272 of the assembly.

Although the present invention is described using planar LED devices, it should be appreciated that other forms of LED devices such as nanowires can be used. And while the assembly is described with LED devices, other semiconductor devices, such as transistors, capacitors, memory cells, integrated circuits, photodetectors, or photovoltaic cells can be implemented in the assembly.

What is claimed is:

1. A completed assembly suitable for emitting light, comprising:
    a substrate, wherein the substrate is a single crystal material having a first surface and a second surface, wherein the second surface is opposite the first surface, and wherein the first surface has an area less than 50 mm$^2$;
    a plurality of LEDs in immediate physical contact with the first surface of the substrate, wherein the LEDs are substantially crystal lattice matched with the substrate, wherein the plurality of LEDs includes three or more LEDs, wherein each LED is not in electrical contact with any other LED, and wherein there is a gap between each LED of the plurality and its nearest neighbor LED; and
    a first encapsulant layer containing a first phosphor overlying at least a portion of at least one but not all LEDs of the plurality.

2. The completed assembly of claim 1 further comprising a dielectric layer overlying the plurality of LEDs wherein the dielectric layer comprises first and second open regions exposing first and second portions of each LED of the plurality.

3. The completed assembly of claim 2 wherein the dielectric layer has a top surface substantially parallel to the first surface of the substrate.

4. The completed assembly of claim 2 wherein the dielectric layer comprises silicon oxide, titanium oxide, aluminum oxide, or silicon nitride.

5. The completed assembly of claim 2 further comprising:
a plurality of vias formed through the substrate and the dielectric layer; and
a plurality of wires wherein each wire of the plurality extends through a respective via of the plurality.

6. The completed assembly of claim 5 wherein at least a portion of the plurality of wires comprise a material selected from a group consisting of: copper, silicon, tungsten, and titanium.

7. The completed assembly of claim 5 wherein some portion of each of the vias of the plurality has a cross sectional area of between 10 and 7500 microns squared, wherein the cross sectional area is about parallel to the second surface of the substrate.

8. The completed assembly of claim 5 further comprising a plurality of wiring structures, wherein each wiring structure is in electrical contact with one portion of one LED of the plurality and one wire of the plurality, and wherein each wiring structure is not fabricated by wire bonding.

9. The completed assembly of claim 8 wherein at least a portion of the wiring structures comprise a material selected from a group consisting of: nickel, titanium, titanium nitride, aluminum, copper, silver, gold, tantalum, tantalum nitride, and tungsten.

10. The completed assembly of claim 1 wherein the first phosphor is excited by light with a dominant wavelength of between 420 and 470 nm and emits light with a dominant wavelength of between 500 and 550 nm.

11. The completed assembly of claim 1 wherein the first encapsulant layer is deposited by screen printing.

12. The completed assembly of claim 1 wherein the first encapsulant layer comprises silicone, epoxy, or polycarbonate.

13. The completed assembly of claim 1 further comprising a second encapsulant layer containing a second phosphor overlying a portion of at least one but not all LEDs of the plurality.

14. The completed assembly of claim 13 wherein the second phosphor is excited by light with a dominant wavelength of between 420 and 470 nm and emits light with a dominant wavelength of between 610 and 730 nm.

15. The completed assembly of claim 13 further comprising a third encapsulant layer overlying as few as one to as many as all of the LEDs of the plurality.

16. The completed assembly of claim 1 wherein the substrate comprises sapphire, silicon carbide, zinc oxide, or gallium nitride.

17. The completed assembly of claim 1 wherein each LED of the plurality measures less than 100 microns on a largest side.

18. The completed assembly of claim 1 wherein the gap between each LED of the plurality is less than 50 microns.

19. The completed assembly of claim 1 wherein all LEDs of the plurality emit light with a dominant wavelength of between 420 and 470 nm.

20. The completed assembly of claim 1 further comprising a reflective layer, wherein the reflective layer contacts the second surface of the substrate.

21. The completed assembly of claim 20 wherein at least a portion of the reflective layer comprise a material selected from a group consisting oft titanium, silver, aluminum, silicon oxide, silicon nitride, aluminum oxide, tantalum oxide, and titanium oxide.

22. A completed assembly suitable for emitting multi-spectral light comprising:
a substrate, wherein the substrate is a single crystal material having first and second surfaces, wherein the first surface is opposite the second surface, and wherein the first surface has an area less than 50 $mm^2$;
a plurality of LEDs in immediate physical contact with the first surface of the substrate, wherein the LEDs are substantially crystal lattice matched with the substrate, wherein the plurality of LEDs includes three or more LEDs, wherein each LED is not in electrical contact with any other LED, and wherein there is a gap between each LED of the plurality and its nearest neighbor LED;
a dielectric layer overlying the plurality of LEDs; and
at least a first phosphor in a first phosphor-containing encapsulant layer and a second phosphor in a phosphor-containing encapsulant layer, wherein each phosphor-containing encapsulant layer overlies at least a portion of one or more LEDs of the plurality.

23. The completed assembly of claim 22 further comprising a plurality of vias formed through the substrate and the dielectric layer, and a plurality of wires wherein each wire of the plurality extends through a respective via of the plurality of vias.

24. The completed assembly of claim 23 wherein a least a portion of the plurality of wires comprise a material selected from a group consisting of: copper, silicon, tungsten, and titanium.

25. The completed assembly of claim 23 further comprising a plurality of wiring structures, wherein each wiring structure is in electrical contact with one portion of one LED of the plurality of LEDs and one wire of the plurality of wires, and wherein each wiring structure is not fabricated by wire bonding.

26. The completed assembly of claim 25 wherein at least a portion of the wiring structures comprise a material selected from a group consisting of: nickel, titanium, titanium nitride, aluminum, copper, silver, gold, tantalum, tantalum nitride, and tungsten.

27. The completed assembly of claim 22 wherein each LED of the plurality measures less than 50 microns on a largest side.

28. The completed assembly of claim 22 wherein each LED of the plurality emits light with a dominant wavelength of between 420 and 470 nm.

29. The completed assembly of claim 22 wherein the first phosphor in the first phosphor-containing encapsulant layer is excited by light with a dominant wavelength of between 420 and 470 nm and emits light with a dominant wavelength of between 500 and 550 nm.

30. The completed assembly of claim 22 wherein the second phosphor in the second phosphor-containing encapsulant layer is excited by light with a dominant wavelength of between 420 and 470 nm and emits light with a dominant wavelength of between 610 and 730 nm.

31. The completed assembly of claim 22 further comprising a reflective layer, wherein the reflective layer contacts the second surface of the substrate.

32. The completed assembly of claim 31 wherein at least a portion of the reflective layer comprise a material selected from a group consisting of: titanium, silver, aluminum, silicon oxide, silicon nitride, aluminum oxide, tantalum oxide, and titanium oxide.

33. A back lit unit comprising:
  a plurality of completed assemblies that emit multispectral light comprising:
    a substrate, wherein the substrate is a single crystal material having first and second surfaces, wherein the first surface is opposite the second surface;
    a plurality of LEDs in immediate physical contact with the first surface of the substrate, wherein the LEDs are substantially crystal lattice matched with the substrate, wherein the plurality of LEDs includes three or more LEDs, wherein each LED is not in electrical contact with any other LED, and wherein there is a gap between each LED of the plurality and its nearest neighbor;
    a dielectric layer overlying the plurality of LEDs;
    a plurality of vias formed through the substrate and the dielectric layer;
    a plurality of wires wherein each wire of the plurality of wires extends through a respective via of the plurality of vias;
    two or more phosphor-containing encapsulant layers, wherein each phosphor-containing encapsulant layer overlies at least a portion of one or more LEDs of the plurality; and
  one or more panels, wherein the plurality of completed assemblies is attached.

34. The back lit unit of claim 33 wherein the panels are printed circuit boards.

35. A method for forming discrete assemblies suitable for emitting light, the method comprising:
  providing a substrate, wherein the substrate is a single crystal material having a first surface and a second surface, and wherein the second surface is opposite the first surface;
  forming a group of LEDs in immediate physical contact with the first surface of the substrate, wherein the group of LEDs is substantially crystal lattice matched with the substrate and wherein each LED of the group is not in electrical contact with any other LED of the group;
  depositing a dielectric layer overlying the group of LEDs;
  depositing a reflective layer, wherein the reflective layer contacts the second surface of the substrate;
  forming a plurality of vias through the reflective layer, the substrate, and the dielectric layer; and
  dividing the substrate and the group of LEDs to create discrete assemblies, wherein each of the assemblies comprises a plurality of LEDs from the group of LEDs, each plurality comprising at least three LEDs.

36. The method of claim 35 wherein the plurality of vias is formed by ablating portions of the reflective layer, the substrate, and the dielectric layer with pulses of laser light.

37. The method of claim 35 further comprising forming a plurality of wires, wherein each wire of the plurality of wires extends through a respective via of the plurality of vias.

38. A method for forming, assemblies suitable for emitting light, the method comprising:
  providing a substrate, wherein the substrate is a single crystal material having a first surface and a second surface and wherein the second surface is opposite the first surface;
  forming a group of LEDs in immediate physical contact with the first surface of the substrate, wherein the group of LEDs is substantially crystal lattice matched with the substrate and wherein each LED of the group is not in electrical contact with any other LED of the group;
  providing two or more phosphor-containing encapsulant layers, wherein each phosphor-containing encapsulant layer overlies at least portions of two or more LEDs of the group;
  depositing a reflective layer, wherein the reflective layer contacts the second surface;
  depositing a dielectric layer overlying the group of LEDs;
  forming a plurality of vias through the reflective layer, the substrate, and the dielectric layer;
  forming a plurality of wires wherein each wire of the plurality of the wires extends through a respective via of the plurality of vias;
  forming first and second open regions in the dielectric layer wherein one of the first and one of the second open regions overlies each LED of the group; and
  forming a plurality of wiring structures wherein a portion of each wiring structure substantially fills one open region of the dielectric layer and is in contact with one portion of an LED of the group and one wire, and wherein each wiring structure is not fabricated by wire bonding.

39. The method of claim 38 wherein the dielectric layer has a top surface substantially parallel to the first surface of the substrate.

40. The method of claim 38 Wherein the plurality of vias is formed by ablating the reflective layer, the substrate, and dielectric layer with pulses of laser light.

41. The method of claim 38 wherein at least a portion of the plurality of wires comprise a material selected from the group consisting of: copper, silicon, tungsten, and titanium.

42. The method of claim 38 wherein forming the plurality of wiring structures includes a masking and etching step.

43. The method of claim 38 wherein at least a portion of the plurality of wiring structures comprise a material selected from a group consisting of: nickel, titanium, titanium nitride, aluminum, copper, silver, gold, tantalum, tantalum nitride, and tungsten.

* * * * *